(12) United States Patent
Jiang et al.

(10) Patent No.: US 11,723,257 B2
(45) Date of Patent: Aug. 8, 2023

(54) ORGANIC LIGHT EMITTING DIODE DISPLAY SUBSTRATE, MANUFACTURING METHOD THEREFOR, AND ORGANIC LIGHT EMITTING DIODE DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhiliang Jiang, Beijing (CN); Pan Zhao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 39 days.

(21) Appl. No.: 17/241,095

(22) Filed: Apr. 27, 2021

(65) Prior Publication Data
US 2022/0102689 A1    Mar. 31, 2022

(30) Foreign Application Priority Data
Sep. 28, 2020   (CN) .......................... 202011044909.9

(51) Int. Cl.
  *H10K 71/00*   (2023.01)
  *H10K 50/844*  (2023.01)
  *H10K 59/40*   (2023.01)
  *H10K 59/124*  (2023.01)

(52) U.S. Cl.
  CPC ........... *H10K 71/00* (2023.02); *H10K 50/844* (2023.02); *H10K 59/124* (2023.02); *H10K 59/40* (2023.02)

(58) Field of Classification Search
  CPC ....................................................... H10K 71/00
  See application file for complete search history.

(56) References Cited

U.S. PATENT DOCUMENTS

| | | | |
|---|---|---|---|
| 2007/0043166 A1* | 2/2007 | Hoshika | H01L 23/293 524/763 |
| 2018/0124933 A1* | 5/2018 | Park | H01L 27/32 |
| 2021/0020703 A1* | 1/2021 | Oh | H10K 59/40 |
| 2022/0102689 A1* | 3/2022 | Jiang | H10K 71/00 |

* cited by examiner

*Primary Examiner* — Caleb E Henry
(74) *Attorney, Agent, or Firm* — Ling Wu; Stephen Yang; Ling and Yang Intellectual Property

(57) ABSTRACT

A manufacturing method for a display substrate, a display substrate and a display device are provided. The display substrate includes a display area and a bonding area at one side of the display area. The bonding area includes an isolation area disposed close to the display area and a bonding pad area disposed at one side of the isolation area far away from the display area. The manufacturing method of the display substrate includes forming a driving structure layer in the display area of a substrate and a bonding structure layer in the bonding area of the substrate, forming a light emitting structure layer on the driving structure layer of the display area, forming an isolation dam on the bonding structure layer of the isolation area, forming an encapsulation structure layer in the display area.

17 Claims, 9 Drawing Sheets

ORGANIC LIGHT EMITTING DIODE DISPLAY SUBSTRATE, MANUFACTURING METHOD THEREFOR, AND ORGANIC LIGHT EMITTING DIODE DISPLAY DEVICE

CROSS-REFERENCE TO RELATED APPLICATION

The present application claims the priority of Chinese Patent Application No. 202011044909.9 filed to the CNIPA on Sep. 28, 2020, the content of which is incorporated herein by reference.

TECHNICAL FIELD

Embodiments of present disclosure relate to, but are not limited to, the technical field of display, in particular to a manufacturing method for a display substrate, a display substrate, and a display device.

BACKGROUND

In recent years, with the rise of active matrix organic light emitting diode (AMOLED) display technology, the market demand for AMOLED display devices is increasing. Organic light emitting diode (OLED) display products adopt a mode that organic light emitting materials emit light autonomously. Therefore, it is necessary to consider how to prevent external water and oxygen from invading the display area in the production process to prevent external water and oxygen from damaging the organic light emitting materials and affecting the display. In some technologies, a thin film encapsulation process is used to encapsulate the OLED light emitting elements in the display area to isolate external water and oxygen. The thin film encapsulation structure includes an inorganic encapsulation layer and an organic encapsulation layer. The inorganic encapsulation layer is formed by chemical vapor deposition in the manufacturing process. In the chemical vapor deposition process a mask is needed to be used to form the inorganic encapsulation layer in a local area, which increases the production cost.

SUMMARY

The following is a summary of subject matters described in detail in the present disclosure. This summary is not intended to limit the protection scope of the claims.

An embodiment of present disclosure provides a manufacturing method for a display substrate. The display substrate includes a display area and a bonding area located at one side of the display area. The bonding area includes an isolation area located close to the display area and a bonding pad area located at one side of the isolation area away from the display area. The method including the following acts: A driving structure layer is formed in the display area of the substrate and a bonding structure layer is formed in the bonding area of the substrate, the driving structure layer including a pixel driving circuit. A light emitting structure layer is formed on the driving structure layer of the display area and an isolation dam is formed on the bonding structure layer of the isolation area, the light emitting structure layer including a light emitting element connected with the pixel driving circuit. An encapsulation structure layer is formed in the display area and an inorganic encapsulation layer is formed in the bonding area, the inorganic encapsulation layer enveloping the isolation dam. The inorganic encapsulation layer in the bonding pad area is removed.

In an exemplary embodiment, the formation of the encapsulation structure layer in the display area and the formation of the inorganic encapsulation layer in the bonding area include the following acts: A first inorganic encapsulation layer is formed on the entire surface of the substrate on which the light emitting structure layer and the isolation dam are formed. An organic encapsulation layer is formed on the first inorganic encapsulation layer in the display area. A second inorganic encapsulation layer is formed on the entire surface of the substrate on which the organic encapsulation layer is formed.

In an exemplary embodiment, prior to the removal of the inorganic encapsulation layer in the bonding pad area, the manufacturing method further includes the following acts: A protection layer is formed on the entire surface of the substrate on which the second inorganic encapsulation layer is formed. A first touch metal layer is formed on the protection layer, the first touch metal layer including connecting bridges disposed in the display area. A touch insulation layer is formed on the entire surface of the substrate on which the first touch metal layer is formed. The removal of the inorganic encapsulation layer in the bonding pad area includes the removal of the touch insulation layer, the protection layer, the second inorganic encapsulation layer and the first inorganic encapsulation layer in the bonding pad area.

The manufacturing method further includes the following act subsequent to the removal the inorganic encapsulation layer of the bonding pad area: A second touch metal layer is formed on the touch insulation layer. The second touch metal layer includes multiple first touch electrodes arranged along a first direction in the display area and multiple second touch electrodes arranged at intervals along a second direction in the display area. Adjacent two first touch electrodes are integrally connected, and adjacent two second touch electrodes are connected with the connecting bridges through via holes provided on the touch insulation layer.

In an exemplary embodiment, prior to the removal of the inorganic encapsulation layer from the bonding pad area, the manufacturing method further includes the following acts: A protection layer is formed on the entire surface of the substrate on which the second inorganic encapsulation layer is formed. A touch metal layer is formed on the protection layer, the touch metal layer including multiple touch electrodes disposed in the display area. The removal of the inorganic encapsulation layer in the bonding pad area includes the removal of the protection layer, the second inorganic encapsulation layer and the first inorganic encapsulation layer in the bonding pad area.

In an exemplary embodiment, subsequent to the removal of the protection layer, the second inorganic encapsulation layer and the first inorganic encapsulation layer in the bonding pad area, the manufacturing method further includes the act that a capping layer covering the touch metal layer is formed.

In an exemplary embodiment, subsequent to the removal of the inorganic encapsulation layer in the bonding pad area, the manufacturing method further includes the following acts: A protection layer is formed on the entire surface of the substrate on which the encapsulation structure layer and the inorganic encapsulation layer are formed. A first touch metal layer is formed on the protection layer, the first touch metal layer including connecting bridges disposed in the display area. A touch insulation layer is formed on the entire surface of the substrate on which the first touch metal layer is formed. The touch insulation layer and the protection layer in the bonding pad area are removed. A second touch metal layer is formed on the touch insulation layer. The second touch metal layer includes multiple first touch electrodes arranged along a first direction in the display area and multiple second touch electrodes arranged at intervals along a second direction in the display area. Adjacent two first touch electrodes are integrally connected, and two adjacent second touch electrodes are connected with the connecting bridges through via holes provided on the touch insulation layer.

In an exemplary embodiment, subsequent to the removal of the inorganic encapsulation layer from the bonding pad area, the manufacturing method further includes the following acts: A protection layer is formed on the entire surface of the substrate on which the encapsulation structure layer and the inorganic encapsulation layer are formed. A touch metal layer is formed on the protection layer, the touch metal layer including multiple touch electrodes disposed in the display area. The protection layer in the bonding pad area is removed. A capping layer capping the touch metal layer is formed.

An embodiment of the present disclosure further provides a display substrate manufactured with any one of the above manufacturing methods for the display substrate.

In an exemplary embodiment, the display area comprises a driving structure layer, a light emitting structure layer and an encapsulation structure layer which are stacked on a substrate. The driving structure layer includes a pixel driving circuit. The light emitting structure layer includes a light emitting element connected with the pixel driving circuit. The bonding area includes a bonding structure layer disposed on a substrate. The bonding structure layer of the isolation area is provided with an isolation dam. The bonding area further includes an inorganic encapsulation layer which covers the bonding structure layer of the isolation area, envelops the isolation dam but exposes the bonding structure layer of the bonding pad area.

In an exemplary embodiment, the bonding structure layer of the isolation area includes a composite insulation layer disposed on the substrate, the first power line and the second power line which are disposed on the composite insulation layer, and the planarization layer disposed on the composite insulation layer. The first power line is disposed closer to the display area than the second power line on which the isolation dame is disposed. In the isolation area, the planarization layer covers the first power line and exposes a surface of the second power line away from the substrate and the surface of the composite insulation layer on a side of the isolation dam away from the display area. The inorganic encapsulation layer is disposed on the planarization layer and on the composite insulation layer being on a side of the isolation dam away from the display area.

In an exemplary embodiment, the display substrate further includes a protection layer, a first touch metal layer, a touch insulation layer and a second touch metal layer which are stacked on the encapsulation structure layer. The first touch metal layer comprises connecting bridges disposed in the display area. The second touch metal layer comprises multiple first touch electrodes arranged in the first direction in the display area and multiple second touch electrodes arranged at intervals in the second direction in the display area. Adjacent two first touch electrodes are integrally connected and adjacent two second touch electrodes are connected with the connecting bridges through via holes provided on the touch insulation layer.

In an exemplary embodiment, the formation of the encapsulation structure layer in the display area and the formation of the inorganic encapsulation layer in the bonding area include the following acts: A first inorganic encapsulation layer is formed on the entire surface of the substrate on which the light emitting structure layer and the isolation dam are formed. An organic encapsulation layer is formed on the first inorganic encapsulation layer in the display area. A second inorganic encapsulation layer is formed on the entire surface of the substrate on which the organic encapsulation layer is formed.

In an exemplary embodiment, prior to the removal of the inorganic encapsulation layer from the bonding pad area, the manufacturing method further includes the following acts: A protection layer is formed on the entire surface of the substrate on which the second inorganic encapsulation layer is formed. A first touch metal layer is formed on the protection layer, the first touch metal layer including connecting bridges disposed in the display area. A touch insulation layer is formed on the entire surface of the substrate on which the first touch metal layer is formed. The removal of the inorganic encapsulation layer in the bonding pad area includes the removal of the touch insulation layer, the protection layer, the second inorganic encapsulation layer and the first inorganic encapsulation layer in the bonding pad area.

The manufacturing method further includes the following act subsequent to the removal the inorganic encapsulation layer of the bonding pad area: A second touch metal layer is formed on the touch insulation layer. The second touch metal layer includes multiple first touch electrodes arranged along a first direction in the display area and multiple second touch electrodes arranged at intervals along a second direction in the display area. Adjacent two first touch electrodes are integrally connected, and adjacent two second touch electrodes are connected with the connecting bridges through via holes provided on the touch insulation layer.

In an exemplary embodiment, prior to the removal of the inorganic encapsulation layer from the bonding pad area, the manufacturing method further includes the following acts: A protection layer is formed on the entire surface of the substrate on which the second inorganic encapsulation layer is formed. A touch metal layer is formed on the protection layer, the touch metal layer including multiple touch electrodes disposed in the display area. The removal of the inorganic encapsulation layer in the bonding pad area includes the removal of the protection layer, the second inorganic encapsulation layer and the first inorganic encapsulation layer in the bonding pad area.

In an exemplary embodiment, subsequent to the removal of the protection layer, the second inorganic encapsulation layer and the first inorganic encapsulation layer in the bonding pad area, the manufacturing method further includes an act that a capping layer covering the touch metal layer is formed.

In an exemplary embodiment, subsequent to the removal of the inorganic encapsulation layer from the bonding pad area, the manufacturing method further includes the following acts: A protection layer is formed on the entire surface of the substrate on which the encapsulation structure layer and the inorganic encapsulation layer are formed. A first touch metal layer is formed on the protection layer, the first touch metal layer including connecting bridges disposed in the display area. A touch insulation layer is formed on the entire surface of the substrate on which the first touch metal layer is formed. The touch insulation layer and the protection layer in the bonding pad area are removed. A second touch metal layer is formed on the touch insulation layer. The second touch metal layer includes multiple first touch electrodes arranged along a first direction in the display area and multiple second touch electrodes arranged at intervals along a second direction in the display area. Adjacent two first touch electrodes are integrally connected, and adjacent two second touch electrodes are connected with the connecting bridges through via holes provided on the touch insulation layer.

In an exemplary embodiment, subsequent to the removal of the inorganic encapsulation layer in the bonding pad area, the manufacturing method further includes the following acts: A protection layer is formed on the entire surface of the substrate on which the encapsulation structure layer and the inorganic encapsulation layer are formed. A touch metal layer is formed on the protection layer, the touch metal layer including multiple touch electrodes disposed in the display area. The protection layer in the bonding pad area is removed. A capping layer covering the touch metal layer is formed.

An embodiment of the present disclosure further provides a display device which includes any one of the above display substrates.

In an exemplary embodiment, the display area comprises a driving structure layer, a light emitting structure layer and an encapsulation structure layer which are stacked on a substrate. The driving structure layer includes a pixel driving circuit. The light emitting structure layer includes a light emitting element connected with the pixel driving circuit. The bonding area includes a bonding structure layer disposed on a substrate. The bonding structure layer of the isolation area is provided with an isolation dam. The bonding area further includes an inorganic encapsulation layer which covers the bonding structure layer of the isolation area, envelops the isolation dam but exposes the bonding structure layer of the bonding pad area.

In an exemplary embodiment, the bonding structure layer of the isolation area includes a composite insulation layer disposed on the substrate, the first power line and the second power line which are disposed on the composite insulation layer, and the planarization layer disposed on the composite insulation layer. The first power line is disposed closer to the display area than the second power line on which the isolation dame is disposed. In the isolation area, the planarization layer covers the first power line and exposes a surface of the second power line away from the substrate and the surface of the composite insulation layer on a side of the isolation dam away from the display area. The inorganic encapsulation layer is disposed on the planarization layer and on the composite insulation layer on a side of the isolation dam away from the display area.

In an exemplary embodiment, the display substrate further includes a protection layer, a first touch metal layer, a touch insulation layer and a second touch metal layer which are stacked on the encapsulation structure layer. The first touch metal layer includes connecting bridges disposed in the display area. The second touch metal layer includes multiple first touch electrodes arranged along the first direction in the display area and multiple second touch electrodes arranged at intervals along the second direction in the display area, adjacent two first touch electrodes being integrally connected and adjacent two second touch electrodes being connected with the connecting bridges through via holes provided on the touch insulation layer.

Other aspects will become apparent after the accompanying drawings and the detailed description are read and understood.

BRIEF DESCRIPTION OF DRAWINGS

The attached drawings are for providing a further understanding of the technical scheme of the present disclosure and constitute a part of the description. They are for explaining the technical scheme of the present disclosure together with the embodiments of the present application and do not constitute a limitation on the technical scheme of the present disclosure.

DETAILED DESCRIPTION

The technical scheme of the present disclosure will be further explained with reference to the drawings and specific embodiments. It should be understood that the specific embodiments described herein are only for explaining the present disclosure, not for limiting the present disclosure. The embodiments and features in the embodiments in the present disclosure may be combined randomly if there is no conflict.

Figure 1:
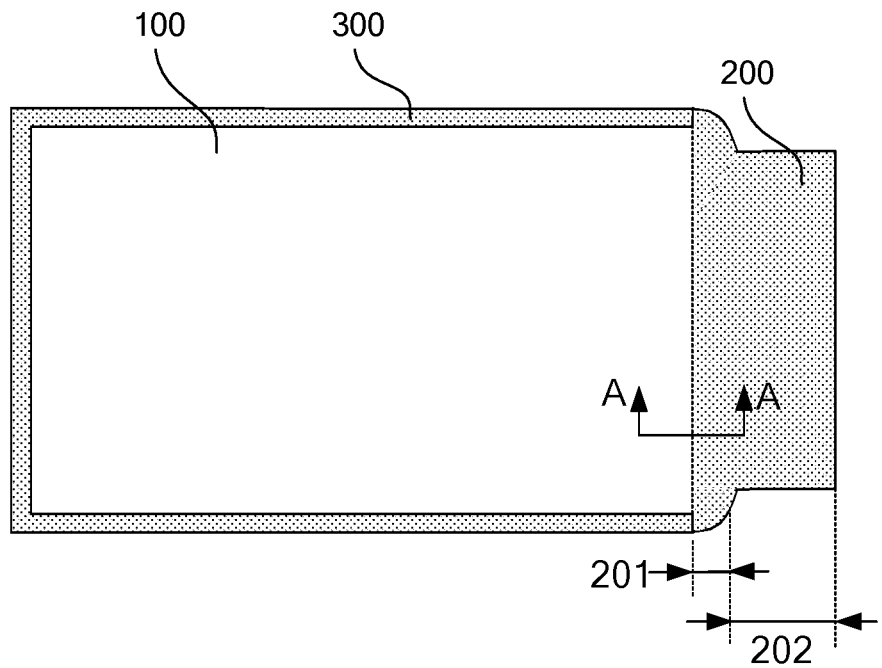
FIG. 1 is a schematic plan view of the structure of a display substrate according to an embodiment of the present disclosure.

FIG. 1 is a schematic plan view of the structure of a display substrate according to an embodiment of the present disclosure. As shown in FIG. 1, a display substrate of an embodiment of the present disclosure includes a display area 100 and a non-display area located at the periphery of the display area 100. The non-display area includes a bonding area 200 located at one side of the display area 100 and a margin area 300 located at other sides of the display area 100. The display area 100 at least includes multiple display units arranged regularly. The bonding area 200 includes an isolation area 201 close to the display area 100 and a bonding pad area 202 located on a side of the isolation area 201 away from the display area 100. The isolation area 201 at least includes an isolation dam and a connecting line that connects the signal lines of the multiple display units in the display area 100 to the bonding pad area 202. The bonding pad area 202 includes binding bonding pads, which are configured to be bonded and connected with external driving Integrated Circuit (IC) and/or Flexible Printed Circuit (FPC) and to provide signals to signal lines of the display area 100 connected to bonding pad area 202 via the bonded IC and/or FPC so as to drive display area 100 to display. The margin area 300 at least includes an isolation dam and a power line transmitting voltage signals to the multiple display units. The bonding area and the isolation dam of the margin area 300 form an annular structure surrounding the display area 100.

Figure 2:
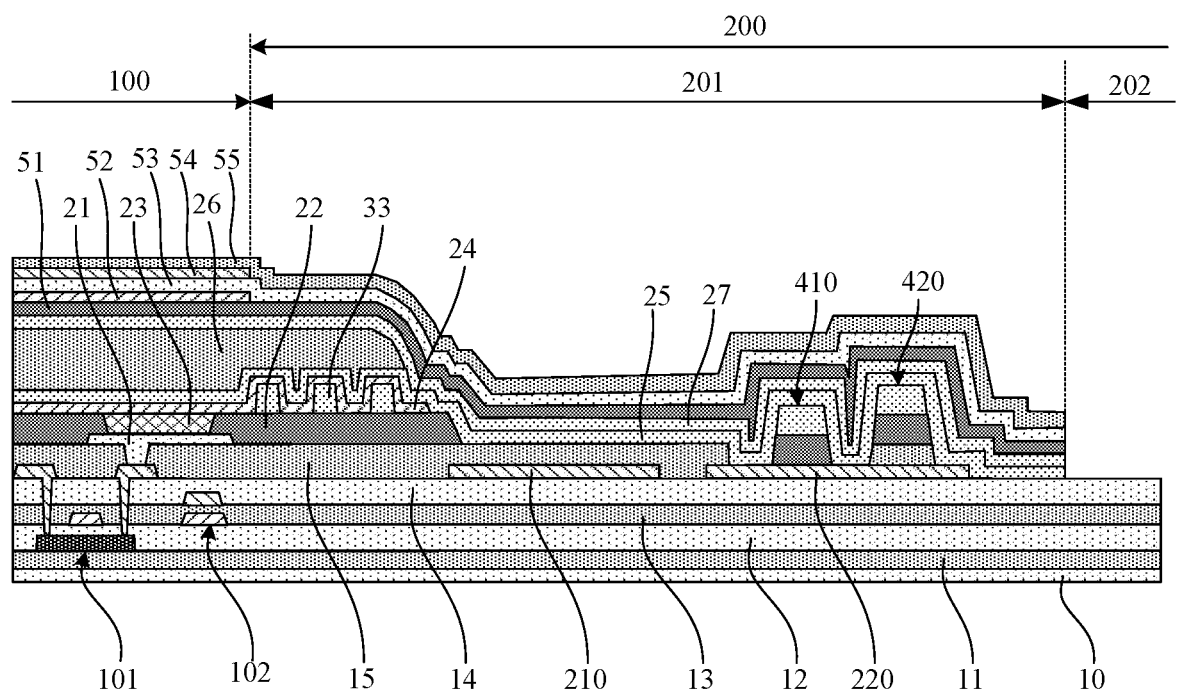
FIG. 2 is a schematic A-A cross-sectional view of the structure of a display substrate according to some exemplary embodiments.

FIG. 2 is a schematic diagram of the structure of a display substrate according to an exemplary embodiment of the present disclosure. It is schematic structural diagram of an A-A direction section in FIG. 1. In an exemplary embodiment, horizontally the display substrate according to an embodiment of the present disclosure includes a display area 100 and a bonding area 200 which is located at one side of the display area 100. Vertically, the display area 100 comprises a flexible substrate 10, a driving structure layer disposed on the flexible substrate 10, a light emitting structure layer disposed on the driving structure layer and an encapsulation structure layer covering the light emitting structure layer. The driving structure layer includes a pixel driving circuit. The light emitting structure layer includes a light emitting element connected with the pixel driving circuit. The bonding area 200 includes an isolation area 201 close to the display area 100 and a bonding pad area 202 located on a side of the isolation area 201 away from the display area 100. The bonding area 200 includes a flexible substrate 10, a bonding structure layer disposed on the flexible substrate 10. The bonding structure layer of the isolation area 201 is provided with a first isolation dam 410 and a second isolation dam 420. The bonding area 200 further includes an inorganic encapsulation layer which covers the bonding structure layer of the isolation area 201, and envelops the first isolation dam 410 and the second isolation dam 420 but exposes the bonding structure layer of the bonding pad area 202.

In some exemplary embodiments the driving structure layer of the display area 100 includes multiple transistors and storage capacitors forming a pixel driving circuit, which is illustrated by FIG. 2 with a driving transistor 101 and a storage capacitor 102 taken as an example. The driving structure layer of the display area 100 includes a first insulation layer 11 disposed on a flexible substrate 10, an active layer disposed on the first insulation layer 11, a second insulation layer 12 covering the active layer, a first gate metal layer disposed on the second insulation layer 12, a third insulation layer 13 covering the first gate metal layer, a second gate metal layer disposed on the third insulation layer 13, a fourth insulation layer 14 covering the second gate metal layer, a source-drain metal layer disposed on the fourth insulation layer 14 and a planarization layer 15 covering the source-drain metal layer. The first gate metal layer at least includes a gate electrode and a first capacitor electrode. The second gate metal layer at least includes a second capacitor electrode. The source-drain metal layer at least includes a source electrode and a drain electrode. The active layer, the gate electrode, the source electrode and the drain electrode form a driving transistor 101. The first capacitor electrode and the second capacitor electrode form a storage capacitor 102. The light emitting structure layer is disposed on the planarization layer 15. The light emitting structure layer includes an anode 21, a pixel definition layer 22, an organic light emitting layer 23 and a cathode 24, anode 21, the organic light emitting layer 23 and the cathode 24 forming a light emitting element, the anode 21 being connected with the drain electrode of the driving transistor 101 through a via hole provided on the planarization layer 15. The encapsulation structure layer includes a first encapsulation layer 25, a second encapsulation layer 26 and a third encapsulation layer 27 which are stacked, the second encapsulation layer 26 of an organic material being disposed between the first encapsulation layer 25 of an inorganic material and the third encapsulation layer 27 of an inorganic material.

In some exemplary embodiments, as shown in FIG. 2, the bonding structure layer of the bonding area 200 includes a composite insulation layer which is disposed on the flexible substrate 10 and includes multiple inorganic insulation layers, a first power line 210 and a second power line 220 which are disposed on the composite insulation layer, and a planarization layer 15 disposed on the composite insulation layer. The first power line 210 is closer to the display area 100 than the second power line 220. The first isolation dam 410 and the second isolation dam 420 are disposed on the second power line and the first isolation dam 410 is closer to the display area 100 than the second isolation dam 420. In the isolation area 201, the planarization layer 15 covers the first power line 210 and exposes the surface of the second power line 220 far away from the flexible substrate 10 and exposes the surface of the composite insulation layer at the side of the second isolation dam 420 far away from the display area 100. The inorganic encapsulation layer is disposed on the planarization layer 15 and envelops the first isolation dam 410 and the second isolation dam 420. The inorganic encapsulation layer is further disposed on the composite insulation layer on the side of the second isolation dam 420 away from the display area 100.

In some exemplary embodiment, the composite insulation layer includes a first insulation layer 11, the second insulation layer 12, the third insulation layer 13 and the fourth insulation layer 14 which are stacked on the flexible substrate 10. The first power line 210 and the second power line 220 are disposed on the fourth insulation layer 14, are arranged on the same layer with the source electrode and the drain electrode of the display area 100, and are formed by the same patterning process. The first power line 210 is connected with the high voltage power line of display area 100 and configured to transmit high voltage signals to the multiple display units of the display area 100. The second power line 220 is connected with the low voltage power line of the margin region 300 and is configured to transmit low voltage signals to the multiple display units of the display area 100. The inorganic encapsulation layer of the isolation area 201 includes a first encapsulation layer 25 and a third encapsulation layer 27 which are stacked. The first encapsulation layer 25 of an inorganic material and the third encapsulation layer 27 of an inorganic material envelope the isolation dam 410 and the second isolation dam 420 and are disposed on the fourth insulation layer 14 on the side of the second isolation dam 420 away from the display area 100. In addition, a pixel define layer 22 is disposed on the planarization layer 15 in the isolation area 201 close to the display region 100. Multiple pillar spacers 33 are arranged at intervals on the pixel define layer 22 and are enveloped by cathode 24.

In some exemplary embodiments, a touch structure is disposed on the encapsulation structure layer of the display substrate to form a Flexible Multi Layer On Cell (FMLOC in short) structure which integrates a display structure with a touch structure and has advantages such as thinness and foldability to meet the product demands of flexible folding, narrow bezel etc. As shown in FIG. 2, the display substrate further includes a touch electrode layer disposed on the encapsulation structure layer of the display area 100 and a touch wiring layer disposed on the inorganic encapsulation layer of the bonding area 200.

In some exemplary embodiments, the touch structure may be a mutual capacitance structure. As shown in FIG. 2, the touch electrode layer of the display area 100 may include a protection layer 51, a first touch metal layer 52, a touch insulation layer 53, a second touch metal layer 54 and a capping layer 55 which are sequentially stacked on the third encapsulation layer 27. The first touch metal layer 52 includes multiple connecting bridges, and the second touch metal layer 54 may include multiple first touch electrodes arranged along a first direction and a plurality of second touch electrodes arranged at intervals along a second direction. Adjacent two first touch electrodes are integrally connected. Adjacent two second touch electrodes are connected with the connecting bridges through via holes provided on the touch insulation layer 53, that is, the connecting bridges connect adjacent two second touch electrodes. The touch wiring layer of the bonding area 200 may include multiple first touch connecting lines connected with multiple first touch electrodes and multiple second touch connecting lines connected with multiple second touch electrodes. In other embodiments, the touch structure may be a self-capacitance structure.

A structure of a display substrate according to an embodiment in the present disclosure is described below with an example of a manufacturing process of a display substrate. The "patterning process" mentioned in the embodiment of the present disclosure includes processes of film layer deposition, photoresist coating, mask exposure, development, etching, and photoresist stripping, etc. The deposition may be selected from any one or more of sputtering, evaporation and chemical vapor deposition. The coating may be selected from any one or more of spray coating and spin coating. The etching may be selected from any one or more of dry etching and wet etching. A "thin film" refers to a layer of thin film manufactured by deposition or coating of a certain material on a substrate. If the "thin film" does not need to be subjected to a patterning process during the whole manufacturing process, a "thin film" may also be called a "layer". When the "thin film" needs to be subjected to a patterning process during the whole manufacturing process, a "thin film" is referred to as a "thin film" prior to the patterning process and as a "layer" subsequent to the patterning process. The "layer" subsequent to the patterning process contains at least one "pattern". In the embodiments of the present disclosure, "A and B are arranged on the same layer" means that A and B are formed simultaneously by a same patterning process. "An orthographic projection of A contains an orthographic projection of B" means that the orthographic projection of B falls within the scope of the orthographic projection of A, or the orthographic projection of A covers the orthographic projection of B.

Figure 3:
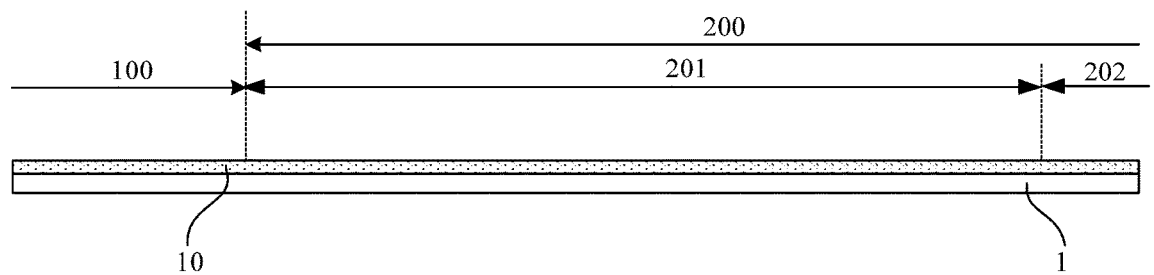
FIG. 3 is a schematic diagram of the display substrate subsequent to the formation of a pattern of a flexible substrate in the process of manufacturing the display substrate according to some exemplary embodiments.

(1) A flexible substrate 10 is manufactured on a glass carrier plate 1. In the present disclosure, the flexible substrate 10 includes a first flexible material layer, a first inorganic material layer, a semiconductor layer, a second flexible material layer and a second inorganic material layer which are stacked on a glass carrier plate 1. The first flexible material layer and the second flexible material layer may be made of polyimide (PI), polyethylene terephthalate (PET) or polymer soft film after surface treatment. The first inorganic material layer and the second inorganic material layer may be made of silicon nitride (SiNx) or silicon oxide (SiOx) to improve the water and oxygen resistance capability of the substrate. The first inorganic material layer and the second inorganic material layers may be called Barrier layers. The semiconductor layer may be made of amorphous silicon (a-si). In an exemplary embodiment, taking a stacked structure of PI1/Barrier1/a-si/PI2/Barrier2 as an example, the manufacturing process may include the following acts: a layer of polyimide is coated on the glass carrier plate 1 which solidifies into a film to form a first flexible (PI1) layer; subsequently, a layer of barrier thin film is deposited on the first flexible layer to form a first barrier (Barrier 1) layer capping the first flexible layer; then a layer of amorphous silicon thin film is deposited on the first barrier layer to form an amorphous silicon (a-si) layer covering the first barrier layer; then a layer of polyimide is coated on the amorphous silicon layer which solidifies into a film to form a second flexible (PI2) layer; then a layer of barrier thin film is deposited on the second flexible layer to form a second barrier (Barrier 2) layer capping the second flexible layer and manufacturing of the flexible substrate 10 is thus finished, as shown in FIG. 3, Subsequent to this process, both the display area 100 and the bonding area 200 include the flexible substrate 10.

(2) A driving structure layer and a bonding structure layer are manufactured on the flexible substrate 10. The driving structure layer of the display area 100 includes a driving transistor 101 and a storage capacitor 102 which form a pixel driving circuit. The bonding structure layer of the bonding area 200 includes a first power line 210 and a second power line 220. In an exemplary embodiment, the manufacturing process of the driving structure layer may include the following acts:

A first insulation thin film and an active layer thin film are sequentially deposited on the flexible substrate 10 and the active layer thin film is patterned by a patterning process to form a first insulation layer 11 capping the entire flexible substrate 10 and an active layer pattern on the first insulation layer 11, the active layer pattern being formed in the display area 100. Subsequent to this patterning process, the bonding area 200 includes the first insulation layer 11 disposed on the flexible substrate 10.

Then, a second insulation thin film and a first metal thin film are sequentially deposited and the first metal thin film is patterned by a patterning process to form a second insulation layer 12 covering the active layer pattern and a first gate metal layer pattern disposed on the second insulation layer 12, the first gate metal layer pattern being formed in the display area 100 and includes at least a first gate electrode and a first capacitor electrode. Subsequent to this patterning process, the bonding area 200 includes the first insulation layer 11 and the second insulation layer 12 stacked on the flexible substrate 10.

Then, a third insulation thin film and a second metal thin film are sequentially deposited and the second metal thin film is patterned by a patterning process to form a third insulation layer 13 covering the first gate metal layer and a second gate metal layer pattern disposed on the third insulation layer 13, the second gate metal layer pattern being formed in the display area 100 and at least including a second capacitor electrode, the position of which corresponds to that of the first capacitor electrode. Subsequent to this patterning process, the bonding area 200 includes the first insulation layer 11, the second insulation layer 12 and the third insulation layer 13 which are stacked on the flexible substrate 10.

Then, a fourth insulation thin film is deposited and patterned by the patterning process to form a pattern of a fourth insulation layer 14 covering the second gate metal layer, the fourth insulation layer is provided with two first via holes exposing the surface of the active layer 12 as the fourth insulation layer, the third insulation layer 13 and the second insulation layer 12 in the two first via holes are etched. Subsequent to this patterning process, the bonding area 200 includes the first insulation layer 11, the second insulation layer 12, the third insulation layer 13 and the fourth insulation layer 14 stacked on the flexible substrate 10.

Then, a third metal thin film is deposited and patterned by a patterning process to form a source-drain metal layer pattern on the fourth insulation layer 14. The source-drain metal layer includes a source electrode and a drain electrode in the display region 100 and a first power line 210 and a second power line 220 in the bonding region 200, the source electrode and the drain electrode are connected with the active layer through the two first via holes respectively.

Figure 5:
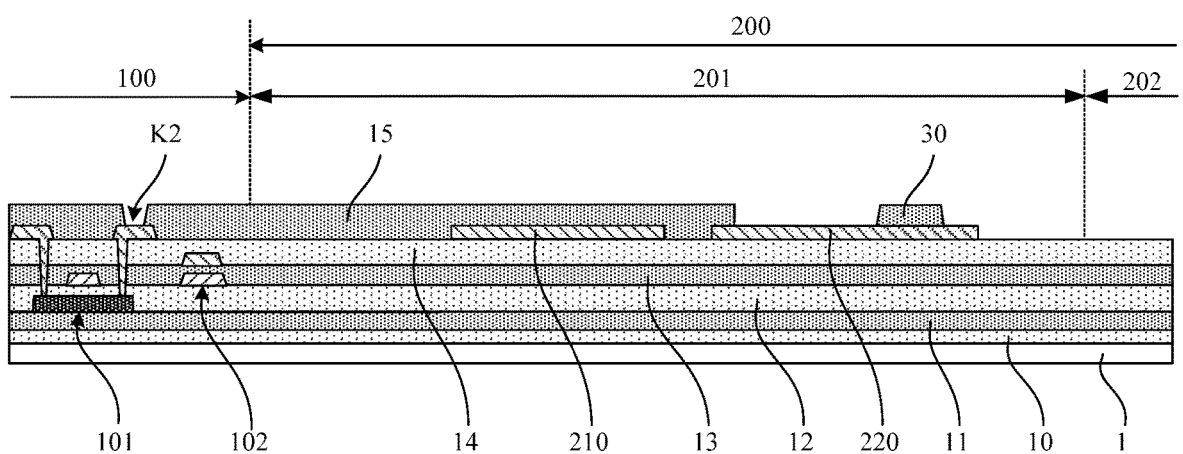
FIG. 5 is a schematic diagram of a display substrate subsequent to the formation of a pattern of a planarization layer in the process of manufacturing the display substrate in some exemplary embodiments.

(3) A planarization thin film of an organic material is coated on the flexible substrate on which the above patterns have been formed to form a planarization (PLN) layer 15 covering the entire flexible substrate 10. A second via hole K2 is formed on the planarization layer 15 in the display area by masking, exposure and development processes. A pattern of a planarization dam base 30 is formed in the second power line 220 in the isolation area 201. The planarization layer 15 in the second via hole is developed off to expose the surface of the drain electrode of the driving transistor 101. The planarization dam base 30 is the dam base of a second isolation dam. The planarization layer 15 in the isolation area 201 covers the first power line 210, and exposes the surface of the second power line 220 and the surface of the composite insulation layer in the part of the isolation area 201 away from the display area 100, as shown in FIG. 5.

Subsequent to this patterning process, the bonding region 200 includes a composite insulation layer disposed on the flexible substrate 10, a first power line 210 and a second power line 220 disposed on the composite insulation layer, and a first planarization layer 15 disposed on the first power line 210 and the second power line 220. The planarization 15 in the isolation area covers the first power line 210 but exposes the surface of second power line 220 and the surface of the composite insulation layer in the part of isolation area 201 away from the display area 100. The planarization dam base is provided on the second power line 220 and is located in the isolation area 201 of the bonding area 200.

Figure 4:
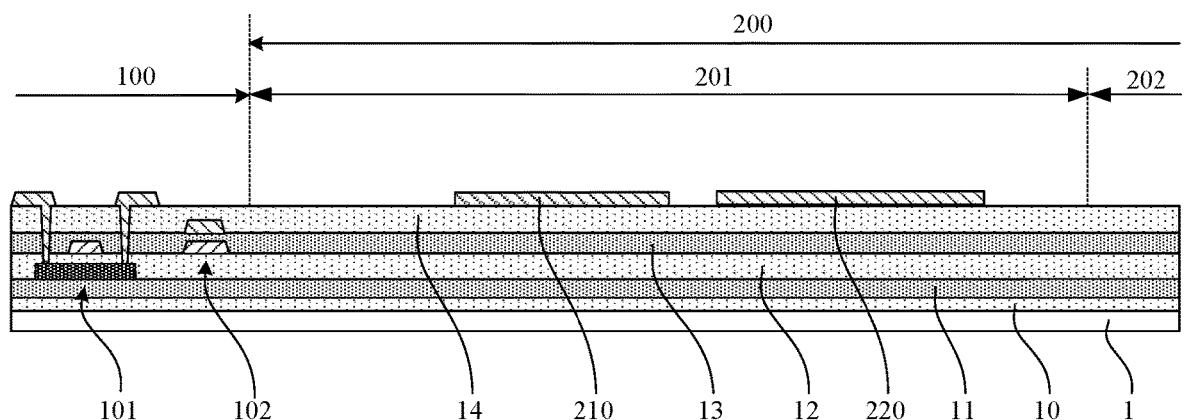
FIG. 4 is a schematic diagram of the display substrate subsequent to the formation of a pattern of a driving structure layer and a bonding structure layer in the process of manufacturing the display substrate in some exemplary embodiments.

Hence, the manufacturing of the patterns of a driving structure layer of the display region 100 and a bonding structure layer of the bonding region 200 on the flexible substrate 10 is completed as shown in FIG. 4. In the driving structure layer of the display region 100, the active layer, the gate electrode, the source electrode and the drain electrode form a first transistor 101, and the first capacitor electrode and the second capacitor electrode form a storage capacitor 102. The bonding structure layer of the bonding area 200 includes a composite insulation layer disposed on the flexible substrate 10, the first power line 210 and the second power line 220 disposed on the composite insulation layer, and the planarization layer 15 disposed on the first power line 210 and the second power line 220 and the planarization dam base 30 disposed on the second power line 220. The composition insulation layer includes the first insulation layer 11, the second insulation layer 12, the third insulation layer 13 and the fourth insulation layer 14. In an exemplary embodiment, the distance between the first power line 210 and the second power line 220 is 50 μm to 100 μm.

In an exemplary embodiment, the first insulation layer, the second insulation layer, the third insulation layer and the fourth insulation layer can be made of any one or more of silicon oxide (SiOx), silicon nitride (SiNx) and silicon oxynitride (SiON), and can be a single layer, multiple layers or a composite layer. The first insulation layer is referred to as a Buffer layer for improving the moisture and oxygen resistance of the substrate. The second and the third insulation layers are referred to as gate insulation (GI) layers. The fourth insulation layer is referred to as an interlayer insulation (ILD) layer. The first metal layer, the second metal layer and the third metal layer may be made of metal material, such as any one or more of silver (Ag), copper (Cu), aluminum (Al), titanium (Ti) and molybdenum (Mo), or alloy of the above metals, such as aluminum neodymium alloy (AlNd) or molybdenum niobium alloy (MoNb), and may have a single-layered structure or a multi-layered composite structure, such as Ti/Al/Ti. The active layer may be made of various materials such as amorphous indium gallium zinc Oxide (a-IGZO), zinc oxynitride (ZnON), indium zinc tin oxide (IZTO), amorphous silicon (a-Si), polysilicon (p-Si), hexathiophene, polythiophene, etc., that is, transistors manufactured based on an Oxide technology, a silicon technology and an organic technology may be applied to embodiments of the present disclosure.

Figure 6:
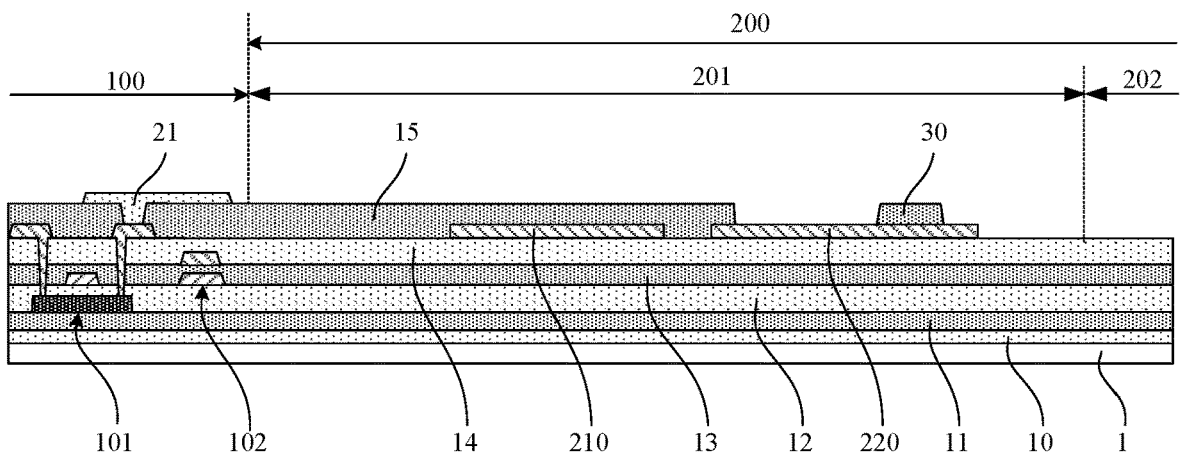
FIG. 6 is a schematic diagram of a display substrate subsequent to the formation of an anode pattern in the process of manufacturing the display substrate in some exemplary embodiments.
Figure 7:
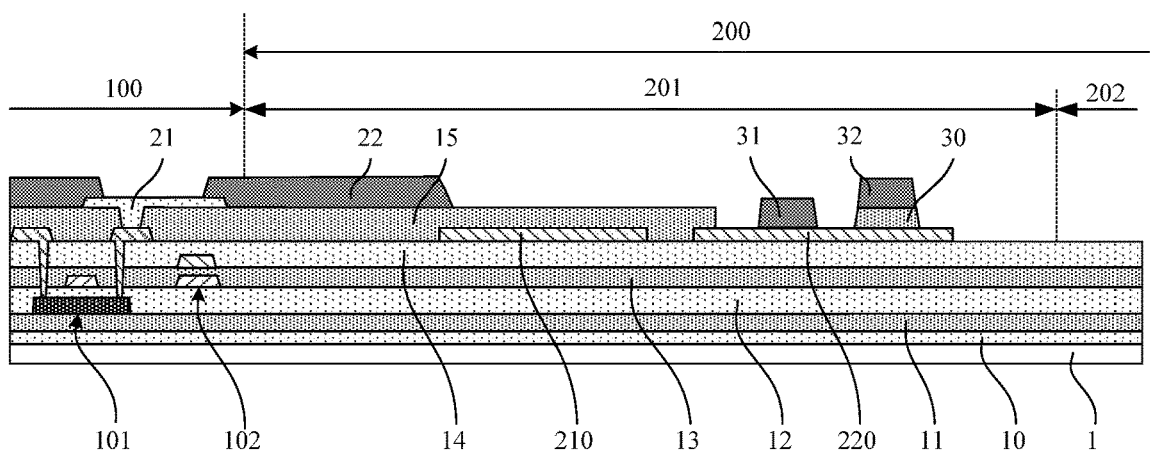
FIG. 7 is a schematic diagram of the display substrate subsequent to the formation of a pattern of a pixel define layer in the process of manufacturing the display substrate in some exemplary embodiments.

(4) On the flexible substrate on which the above patterns have been formed, a transparent conductive film is deposited and patterned by a patterning process to form a pattern of an anode 21. The anode 21 is formed on the planarization layer 15 of the display area 100 and is connected with the first drain electrode of the driving transistor 101 through the second via hole K2, as shown in FIG. 6. Subsequent to this patterning process, the film-layer structure of the bonding area 200 has not changed. In an exemplary embodiment, the transparent conductive film may be made of indium tin oxide (ITO) or indium zinc oxide (IZO).

(5) A pixel define thin film is coated on the substrate 10 on which the above patterns have been formed. A pattern of a pixel define layer (PDL) 22, a first dam base 31 and a second dam base 32 is formed by masking, exposure and development processes. The pixel define layer 22 is formed in the display area 100 and in part of the isolation area 201 close to the display area 100. The pixel define layer 22 in the display area 100 is provided with a pixel opening in which the pixel define layer 22 is developed off to expose the surface of the anode 21. The first dam base 31 and the second dam base 32 are formed in the isolation area 201 in the bonding area 200. The first dam base is formed on the second power line 220 in the isolation area 201. The second dam base 32 is formed on the planarization dam base 30. The distance between the first dam base 31 and the display area 100 is smaller than that between the second dam base 32 and the display area 100. In the embodiments of the present disclosure, the first dam base 31 is used for the formation of a first isolation dam. The planarization dam base 30 and the second dam base 32 are used for the formation of a second isolation dam. In an exemplary embodiment, the pixel define layer may be made of polyimide, acrylic or polyethylene terephthalate, etc.

Figure 8:
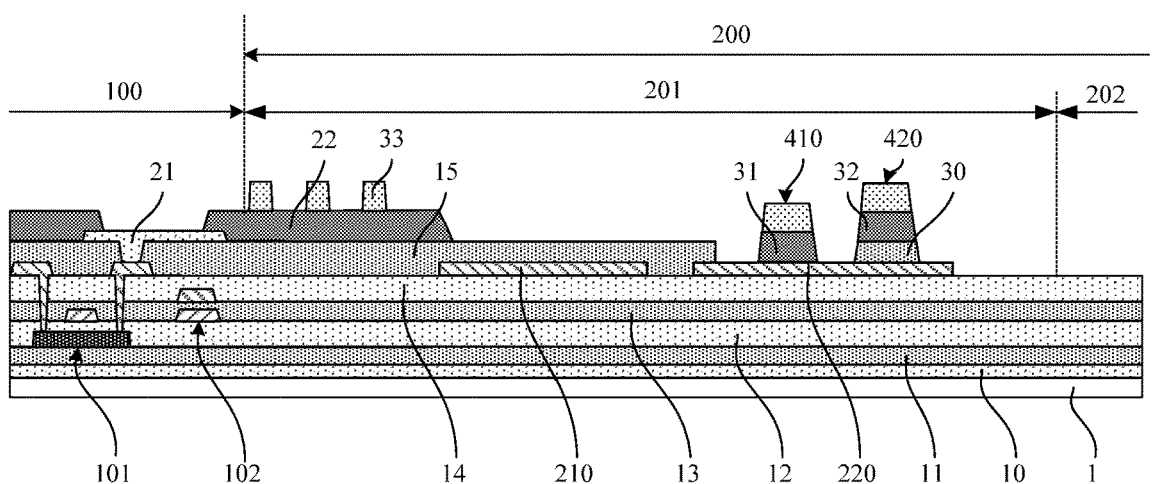
FIG. 8 is a schematic diagram of a display substrate subsequent to the formation of a pattern of a pillar spacer in the process of manufacturing the display substrate in some exemplary embodiments.

(6) A film of an organic material is coated on the flexible substrate on which the above patterns have been formed. A pattern of multiple pillar spacers (PS) 33 are formed by masking, exposure and development processes. The multiple pillar spacers 33 are formed on the pixel define layer 22, the first dam base 31 and the second dam base 32 of the isolation area 201, as shown in FIG. 8. In an exemplary embodiment, the cross-sectional shapes of the planarization dam base 30, the first dam base 31, the second dam base 32 and the pillar spacer 33 are trapezoidal. The first dam base 31 and the pillar spacer 33 on the first dam base 31 form a first support dam 410. The planarization dam base 30, the second dam base 32 and the pillar spacer 33 on the second dam base 32 form a second support dam 420. The distance between the upper end face of the first support dam 410 and the flexible substrate 10 is smaller than the distance between the upper end face of the second support dam 420 and the display area 100. The distance between the first support dam 410 and the display area 100 is smaller than the distance between the second support dame 420 and the display area 100. In an exemplary embodiment, the distance between the first support dam 410 and the second support dam 420 is 20 μm to 60 μm.

Figure 9:
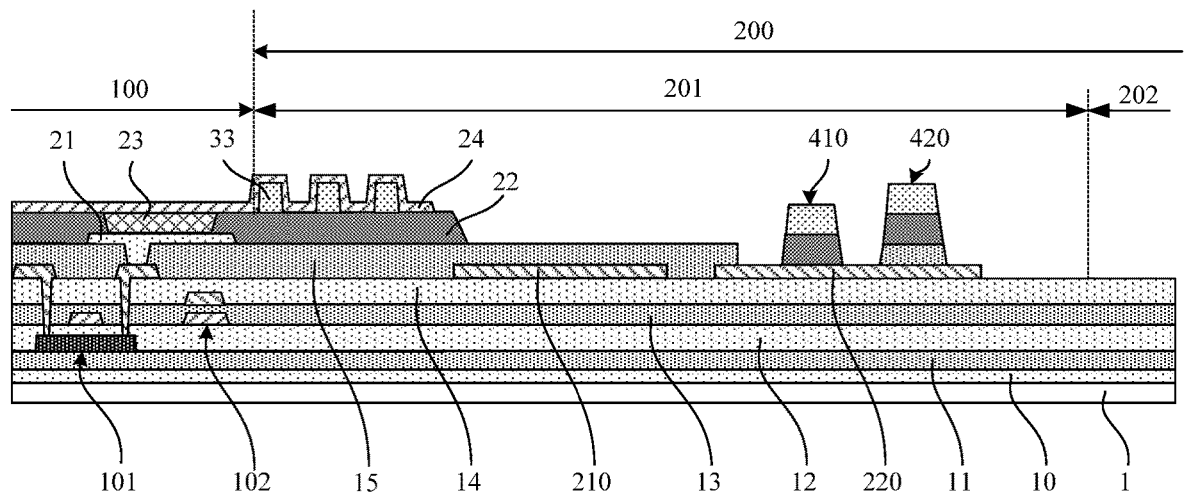
FIG. 9 is a schematic diagram of a display substrate subsequent to the formation of an organic light emitting layer and a cathode pattern in the process of manufacturing the display substrate in some exemplary embodiments.

(7) An organic light emitting layer 23 and a cathode 24 are sequentially formed on the flexible substrate on which the above patterns have been formed, as shown in FIG. 9. The organic light emitting layer 23 is formed in the pixel opening of the display area 100 to achieve the connection between the organic light emitting layer 23 and the anode 21. The cathode 24 is formed on the pixel define layer 22 and is connected with the organic light emitting layer 23, the cathode 24 envelops multiple pillar spacers 33 on the pixel define layer 22 in the isolation area. In an exemplary embodiment, the cathode may be made of any one or more of magnesium (Mg), silver (Ag), aluminum (Al), copper (Cu) and lithium (Li), or an alloy made of any one or more of the above metals. In other examples, a cavity injection layer and a cavity transport layer may be formed between the organic light emitting layer 23 and the anode 24. An electron transport layer and an electron injection layer may be formed between the organic light emitting layer 23 and the cathode 24.

Figure 10:
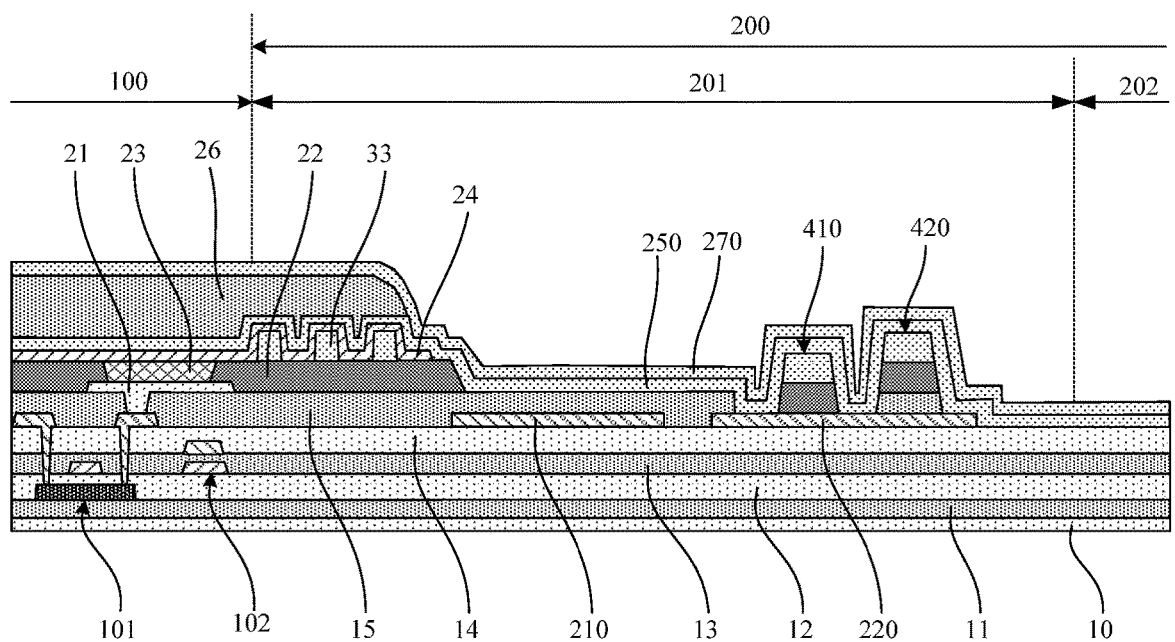
FIG. 10 is a schematic diagram of a display substrate subsequent to the formation of a composite encapsulation thin film in the process of manufacturing the display substrate in some exemplary embodiments.

(8) A composite encapsulation thin film is formed on the flexible substrate 10 on which the above patterns have been formed. The formation of the composite encapsulation thin film includes depositing a first encapsulation thin film 250 on the entire surface of the flexible substrate 10 on which the above patterns have been formed, forming a second encapsulation layer 26 on the first encapsulation thin film 250 in the display area 100, and depositing a third encapsulation thin film 270 on the entire surface of the flexible substrate 10 on which the above patterns have been formed. The first encapsulation thin film 250 and the third encapsulation thin film 270 both cover the entire surface of the flexible substrate 10, as shown in FIG. 10. The first encapsulation thin film 250 and the third encapsulation thin film 270 are both made of an inorganic material while the second encapsulation layer 26 is made of an organic material. The second encapsulation layer 26 may be made by using an ink jet printing process.

Figure 11:
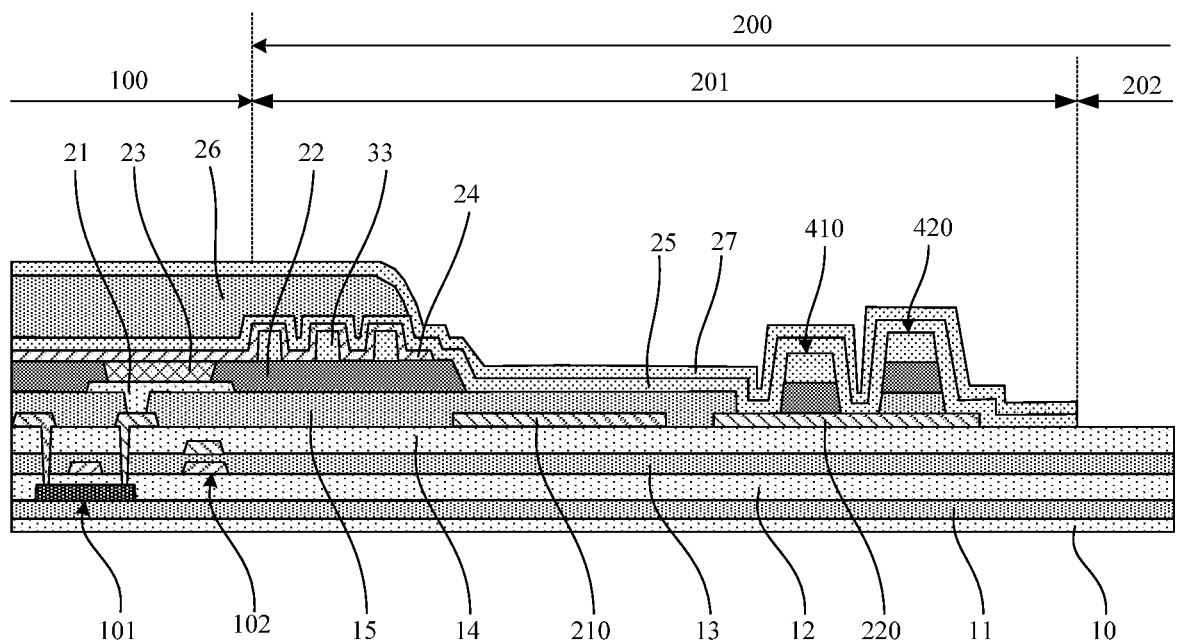
FIG. 11 is a schematic diagram of the display substrate subsequent to the formation of an encapsulation structure layer by etching a composite encapsulation thin film in the process of manufacturing the display substrate in some exemplary embodiments.

(9) The composite encapsulation thin film is subjected to etching. The first encapsulation thin film 250 and the third encapsulation thin film 270 in the bonding pad area 202 of the bonding area 200 are etched to form a encapsulation structure layer in the display area 100 and to form an inorganic encapsulation layer in the isolation area 201 of the bonding area 200, the bonding pads of the bonding pad area 202 are exposed, as shown in FIG. 11.

The encapsulation structure layer of the display area 100 includes a first encapsulation layer 25, a second encapsulation layer 26 and a third encapsulation layer 27 which are stacked. The inorganic encapsulation layer of the isolation area 201 includes the first encapsulation layer 25 and the third encapsulation layer 27 which are stacked. The first encapsulation layer 25 is made of an inorganic material, covers the cathode 24 in the display area 100 and envelops the multiple pillar spacers 33, the first support dam 410 and the second support dam 420 in the isolation area 201. The second encapsulation layer 26 is made of an organic material, and is disposed in the display area 100 and the area of the bonding area 201 where the pillar spacers 33 are located. The third encapsulation layer 27 is made of an inorganic material and covers the first encapsulation layer 25 and the second encapsulation layer 26. Since the surface of the second power line 220 in the isolation area 201 and the surface of the fourth insulation layer 14 on a side of the second isolation dam 420 away from the display area 100 are exposed and therefore, the first encapsulation layer 25 of an inorganic material and the third encapsulation layer 27 of an inorganic material directly cover the exposed second power line 220 and the fourth insulation layer 14. The inorganic encapsulation layer in the isolation area 201 can ensure that external moisture does not enter the display area 100 and thus avoiding the occurrence of black shading and improving the encapsulation effect and process quality.

In an exemplary embodiment, the first encapsulation layer 25 and the third encapsulation layer 27 are all made by using a chemical vapor deposition method in conjunction with the use of a mask. During the deposition process, the mask masks the bonding pads of the bonding pad area 202, which prevents the first encapsulation layer 25 and the third encapsulation layer 27 from being deposited on the bonding pads. However, the use of a mask in the deposition process will increase the cost of production.

In this embodiment of the disclosure, in the process of manufacturing the encapsulation structure layer of the display area 100 and the inorganic encapsulation layer of the bonding area 200, the first encapsulation thin film 250 is deposited on the whole surface of the flexible substrate 10 first and then the second encapsulation layer 26 is formed on the display area 100, and then the third encapsulation thin film 270 is deposited on the entire surface of the flexible substrate 10 to form a composite encapsulation thin film. Then, the composite encapsulation thin film is etched. The first encapsulation thin film 250 and the third encapsulation thin film 270 stacked in the bonding pad area 202 of the bonding area 200 are etched to expose the bonding pads of the bonding pad area 202. Thus, an encapsulation structure layer is formed in the display area 100 and an inorganic encapsulation layer is formed in the isolation area 201 of the bonding area 200. The encapsulation structure layer of the display area 100 includes a first encapsulation layer 25, a second encapsulation layer 26 and a third encapsulation layer 27 which are stacked. The inorganic encapsulation layer of the isolation area 201 of the bonding region 200 includes the first encapsulation layer 25 and the third encapsulation layer 27 which are stacked. Since the first encapsulation layer 25 and the third encapsulation layer 27 are all formed by first depositing the encapsulation thin films on the entire surface of the flexible substrate 10 and then etching the encapsulation thin films, and the process of depositing the encapsulation thin films on the entire surface of the flexible substrate 10 does not need a mask. Therefore, during film formation in the process of manufacturing the first encapsulation layer 25 and the third encapsulation layer 27, a mask is not needed. Compared with some technologies that the first encapsulation layer 25 and the third encapsulation layer 27 are all manufactured by using a chemical vapor deposition (CVD) method in conjunction with a corresponding Mask, the method for forming the first encapsulation layer 25 and the third encapsulation layer 27 without using Mask in the process of film formation in the embodiment of the disclosure can save production cost.

In some exemplary embodiments, the display substrate further includes a functional film layer, such as a touch structure layer, disposed on the side of the encapsulation structure layer away from the substrate 10. In the above step (9), the process where the composite encapsulation thin film is etched to etch the first encapsulation thin film 250 and the third encapsulation thin film 270 of the bonding pad area 202 of the bonding area 200 to expose the bonding pads of the bonding pad area 202 can be performed prior to the formation of the subsequent functional film layer or during the formation of the subsequent functional film layer.

Figure 12:
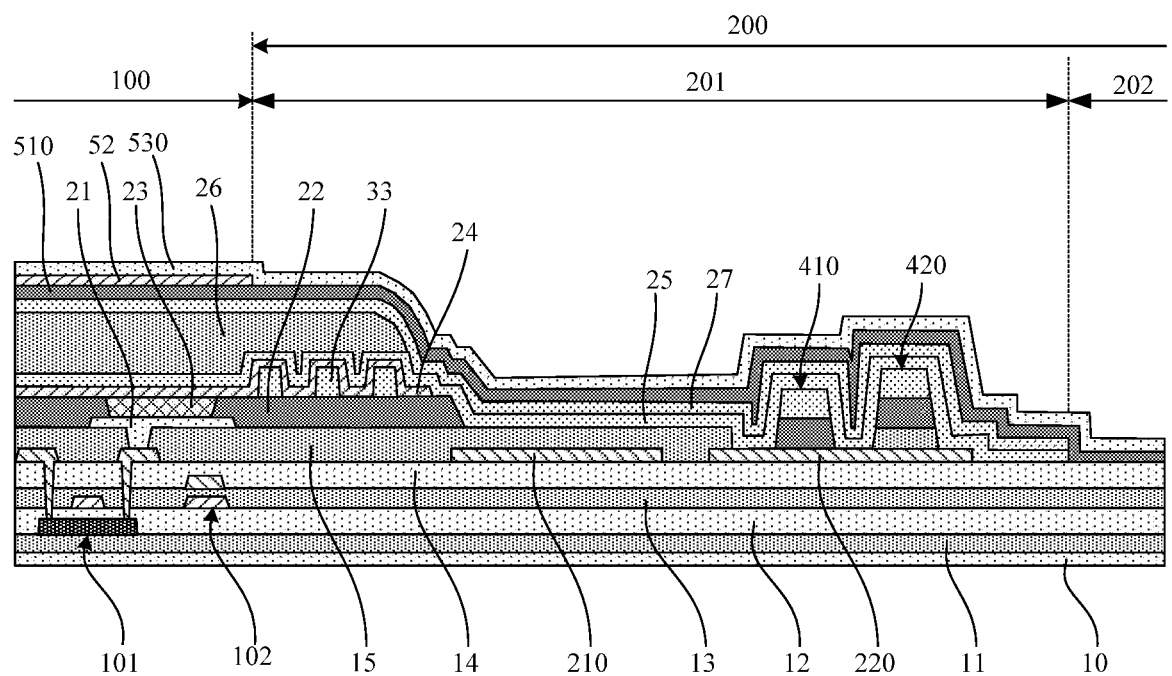
FIG. 12 is a schematic diagram of a display substrate subsequent to the formation of a protection thin film, a first touch metal layer and a touch insulation thin film in the process of manufacturing the display substrate in some exemplary embodiments.

(10) A protection thin film 510 is deposited on the entire surface of the flexible substrate 10 on which the above patterns have been formed and then a first touch metal thin film is deposited, and patterned by a patterning process to form a first touch metal layer 52 which includes a pattern of connecting bridges in the display area 100. Then, a touch insulation thin film 530 is deposited. The bonding pad area 202 of the bonding area 200 includes the touch insulation thin film 530 and the protection thin film 510 which are stacked on the composite insulation layer, as shown in FIG. 12.

Figure 13:
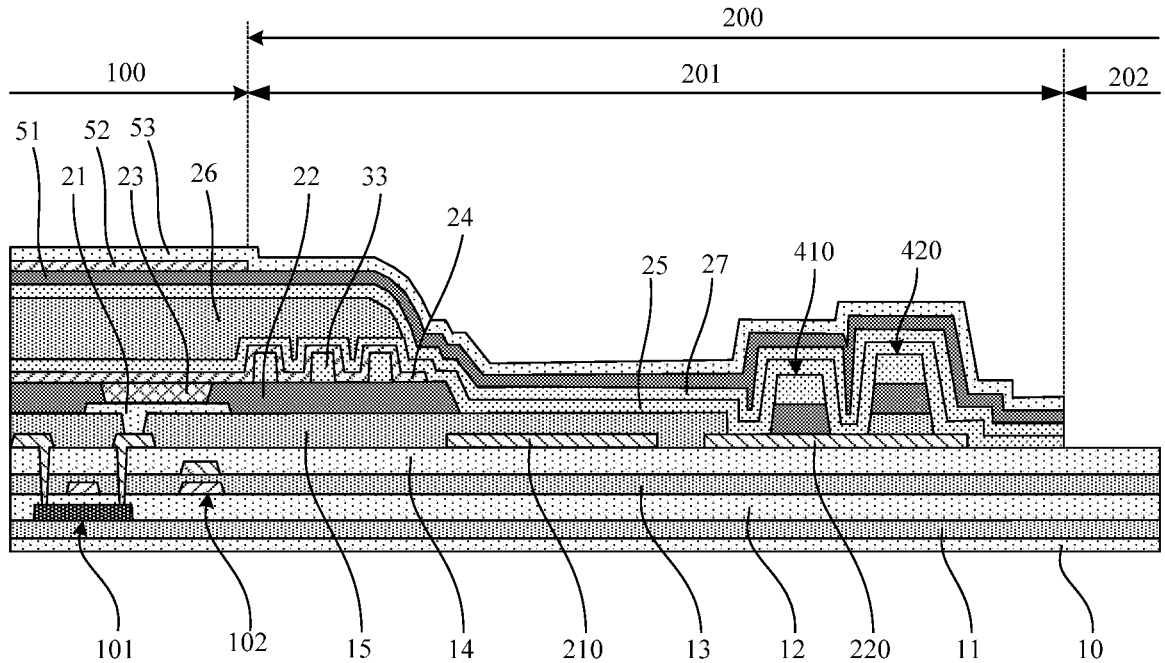
FIG. 13 is a schematic diagram of a display substrate subsequent to the formation of a protection layer, a first touch metal layer and a touch insulation layer in the process of manufacturing the display substrate in some exemplary embodiments.

(11) The touch insulation thin film 530 and the protection thin film 510 in the bonding pad area 202 of the bonding area 200 are etched away to form a protection layer 51, a first touch metal layer 52 and a touch insulation layer 53. The protection layer 51 covers the display area 100 and the isolation area 201 of the bonding area 200 and exposes the bonding pads of the bonding pad area 202 of the bonding area 200. The first touch metal layer 52 includes a pattern of connecting bridges in the display area 100. A touch insulation layer 53 is disposed in the isolation area 201 between the display area 100 and the bonding area 200, covering the first touch metal layer 52 and exposing the bonding pads of the bonding pad area 202 of the bonding area 200, as shown in FIG. 13. In an exemplary embodiment, the protection layer 51 may be made of an inorganic material which may be any one or more of silicon oxide (SiOx), silicon nitride (SiNx) and silicon oxynitride (SiON). The touch insulation layer 5 can be made of an organic resin material such as acrylic, or be made of an inorganic material such as any one or more of silicon oxide (SiOx), silicon nitride (SiNx) and silicon oxynitride (SiON).

(12) A second touch metal thin film is deposited on the flexible substrate 10 on which the above patterns have been formed. The second touch metal thin film is patterned by a patterning process to form a pattern of a second touch metal layer 54. The second touch metal layer 54 includes multiple first touch electrodes arranged along a first direction, multiple second touch electrodes arranged at intervals along a second direction, first touch electrode leads connected with the first touch electrodes and the second touch electrode leads connected with the second touch electrodes in the display area 100. Adjacent two first touch electrodes are integrally connected. Adjacent two first touch electrodes are connected directly in the second touch metal layer 54. Adjacent two second touch electrodes are connected with the connecting bridges of the first touch metal layer 52 through the via holes provided on the touch insulation layer 53. The second touch metal layer 54 includes a first touch connection line connected with the first touch electrode leads and a second touch connection line connected with the second touch electrode leads in the bonding area 200.

Then, a capping thin film is coated on the substrate 10 on which the above patterns have been formed. A capping layer 55 is formed in the display area 100 and in the bonding area 200 by masking, exposure and development processes, covering the second touch metal layer 54 and exposing the bonding pads of the bonding pad area 202, as shown in FIG. 2. The material of the capping layer 55 may be an organic material, and may be an inorganic material in other examples.

In the above embodiment, steps (10) to (12) are to prepare the touch control structure layer after etching the composite encapsulation thin film to form the encapsulation structure layer of the display area 100 and the inorganic encapsulation layer of the bonding area 200.

Figure 14:
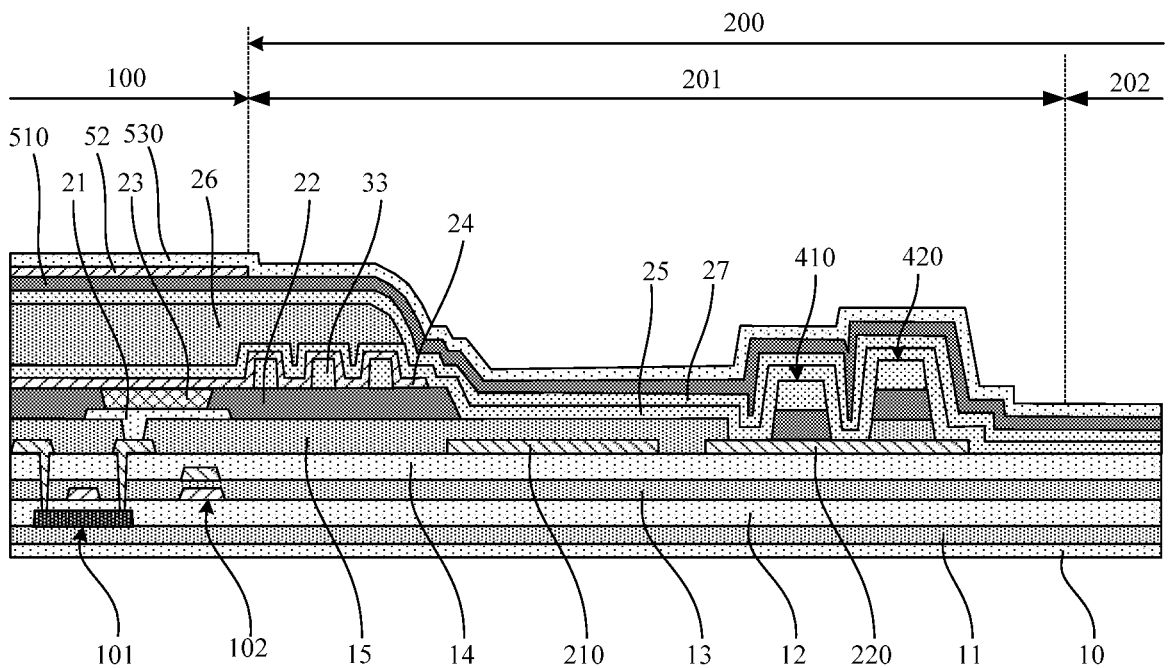
FIG. 14 is a schematic diagram of a display substrate subsequent to the formation of a protection thin film, a first touch metal layer and a touch insulation thin film in the process of manufacturing the display substrate in some exemplary embodiments.

In other exemplary embodiments, the process of etching the composite encapsulation thin film to form the encapsulation structure layer of the display area 100 and the inorganic encapsulation layer of the bonding area 200 is performed during the manufacturing of the subsequent touch structure layer. In an exemplary embodiment, subsequent to step (8) of the above embodiment, the subsequent manufacturing process of the touch structure layer may include the following steps:

Continue to the aforementioned step (8), subsequent to the formation of the composite encapsulation thin film (as shown in FIG. 10), a protection thin film 510 is deposited on the entire surface of the flexible substrate 10 on which the above patterns have been formed. Then a first touch metal thin film is deposited and patterned by a patterning process to form a first touch metal layer 52 which includes a pattern of connecting bridges in the display area 100. Then, a touch insulation thin film 530 is deposited. The bonding pad area 202 of the bonding area 200 includes a first encapsulation thin film 250, a third encapsulation thin film 270, a protection thin film 510 and a touch insulation thin film 530 stacked on the composite insulation layer, as shown in FIG. 14.

Figure 15:
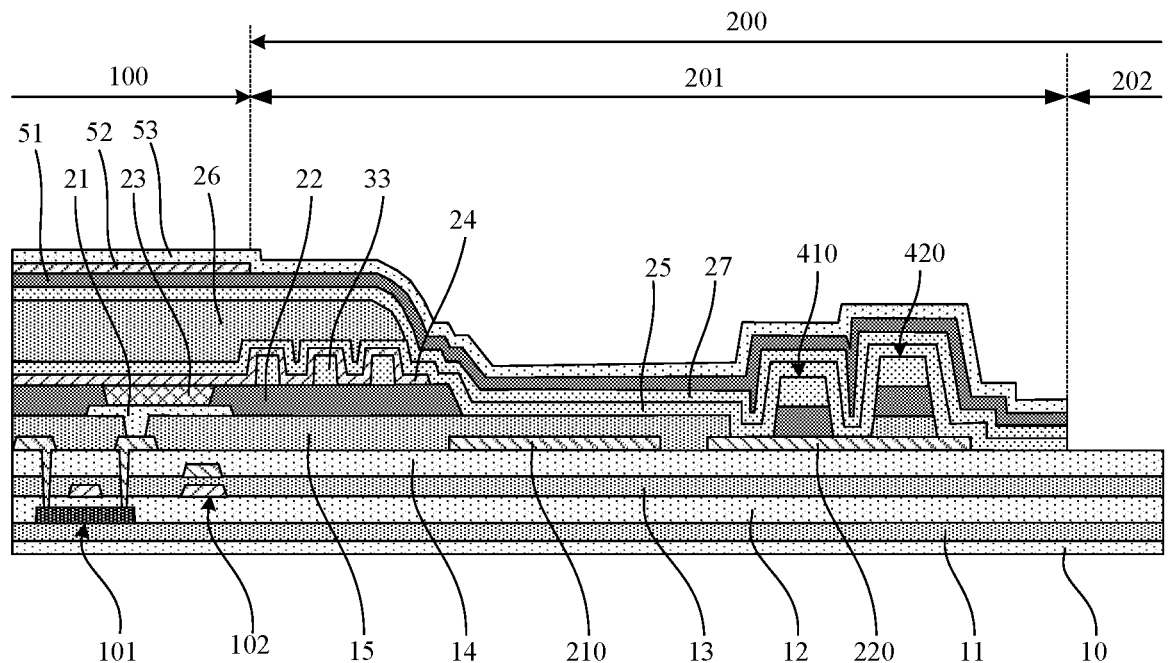
FIG. 15 is a schematic diagram of a display substrate subsequent to the formation of an encapsulation structure layer, a protection layer, a first touch metal layer and a touch insulation layer in the process of manufacturing the display substrate in some exemplary embodiments.

Then, the first encapsulation thin film 250, the third encapsulation thin film 270, the protection thin film 510 and the touch insulation thin film 530 in the bonding pad area 202 of the bonding area 200 are all etched and removed to allow the bonding pads of the bonding pad area 202 of the bonding area 200 to be exposed. Therefore, an encapsulation structure layer is formed in the display area 100; An inorganic encapsulation layer is formed in the isolation area 201 of the bonding area 200; A protection layer 51, a first touch metal layer 52 and a touch insulation layer 53 are formed and stacked on the third encapsulation layer 27, as shown in FIG. 15, which may be the same as the structure shown in FIG. 13 in the previous embodiment. In this step, during the process of etching the touch insulation thin film 530 to form the touch insulation layer 53, the first encapsulation thin film 250, the third encapsulation thin film 270, the protection thin film 510 and the touch insulation thin film 530 in the bonding pad area 202 need to be etched and removed at the same time. Considering that the etches of the first encapsulation thin film 250 and the third encapsulation thin film 270 are added during the etching process, when designing the size of the via hole on the touch insulation layer 53, it is needed to compensate the via hole size reduced in the etching process.

Eventually, a second touch metal thin film is deposited on the flexible substrate on which the above patterns have been formed. The second touch metal thin film is patterned by patterning process to form the pattern of a second touch metal layer 54. Then, a capping thin film is coated on the substrate 10 on which the above patterns have been formed. A capping layer 55 is formed in the display area 100 and in the bonding area 200 by masking, exposure and development processes, covering the second touch metal layer 54 and exposing the bonding pads of the bonding pad area 202, as shown in FIG. 2. The material of the capping layer 55 may be an organic material or an inorganic material.

Figure 16:
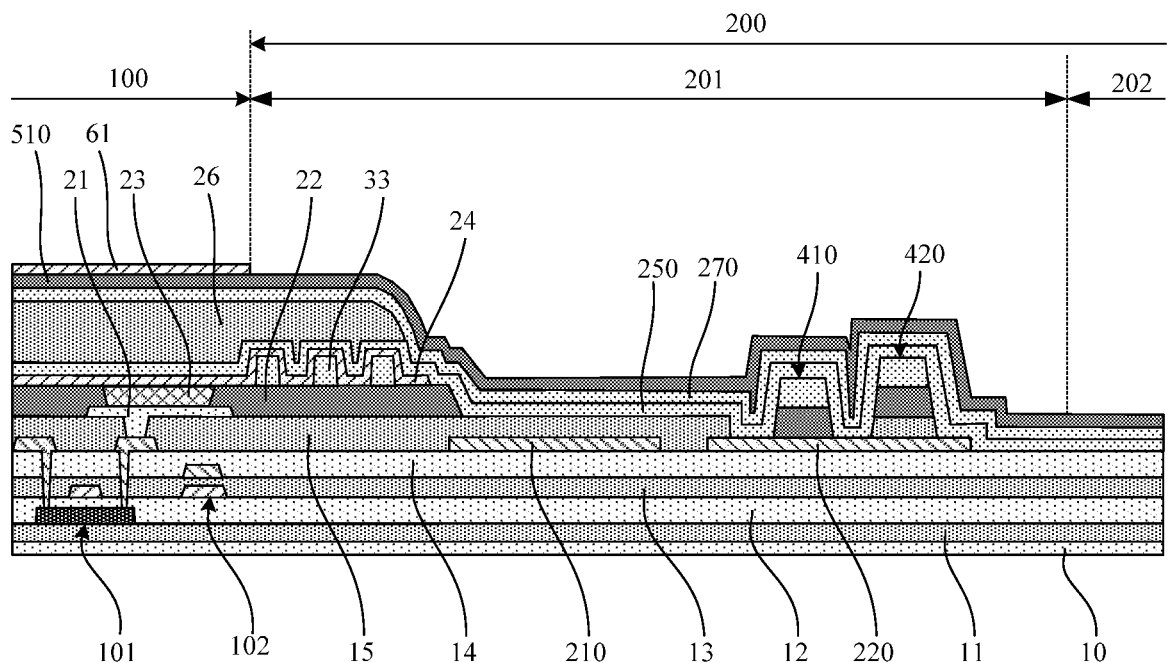
FIG. 16 is a schematic diagram of a display substrate subsequent to the formation of a protection thin film and a touch metal layer in the process of manufacturing the display substrate in some exemplary embodiments.

In the previous embodiment, the touch structure layer includes two metal layers, namely the first touch metal layer 52 and the second touch metal layer 54, and the touch structure is a mutual capacitance structure. In other exemplary embodiments, touch structure layer may include one metal layer and the touch structure layer is a self-capacitance structure. For example, after step (8) of the previous embodiment, the subsequent manufacturing process of the touch structure layer may include the following steps:

Continue to the aforementioned step (8), subsequent to the formation of the composite encapsulation thin film (as shown in FIG. 10), a protection thin film 510 is deposited on the entire surface of the flexible substrate 10 on which the above patterns have been formed. Then a touch metal thin film is deposited and patterned by a patterning process to form a touch metal layer 61. The touch metal layer 61 in the display area 100 includes multiple touch electrodes arranged in an array and touch electrode leads connected with the touch electrodes, and the touch metal layer 61 in the bonding area 200 includes touch connection lines connected with the touch electrode leads in the display area 100, as shown in FIG. 16.

Figure 17:
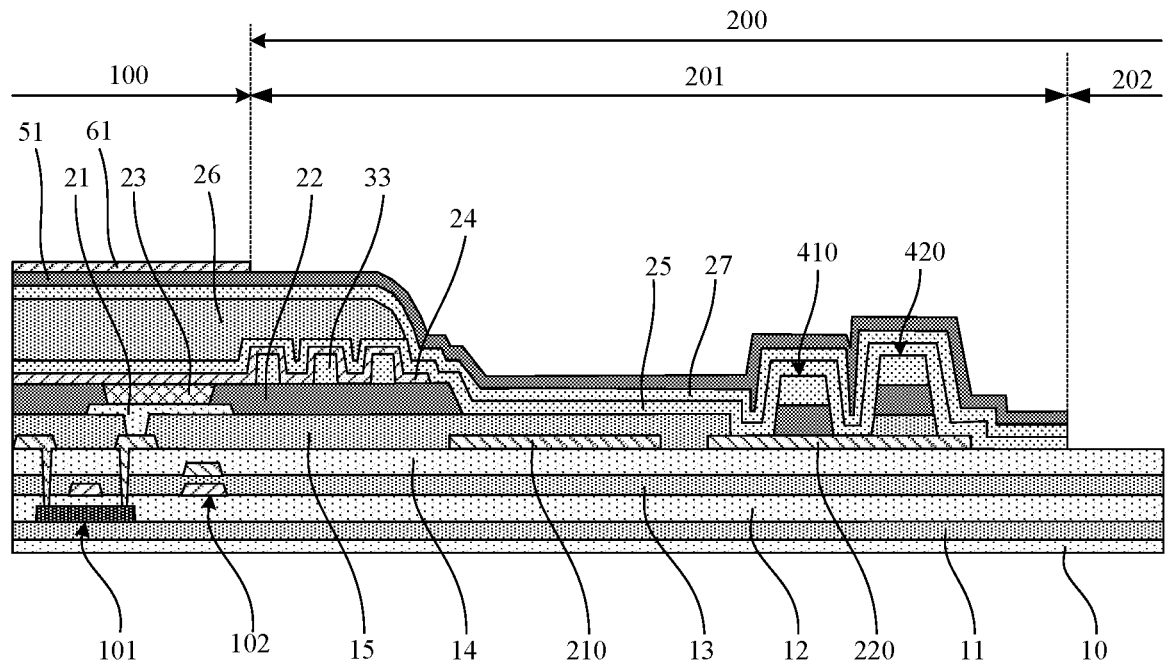
FIG. 17 is a schematic diagram of a display substrate subsequent to the formation of a protection layer and a touch metal layer in the process of manufacturing the display substrate in some exemplary embodiments.

Then, the protection thin film 510 in the bonding pad area 202 of the bonding area 200 is etched and removed to form a protection layer 51, which exposes the bonding pads of the bonding pad area 202, as shown in FIG. 17.

Figure 18:
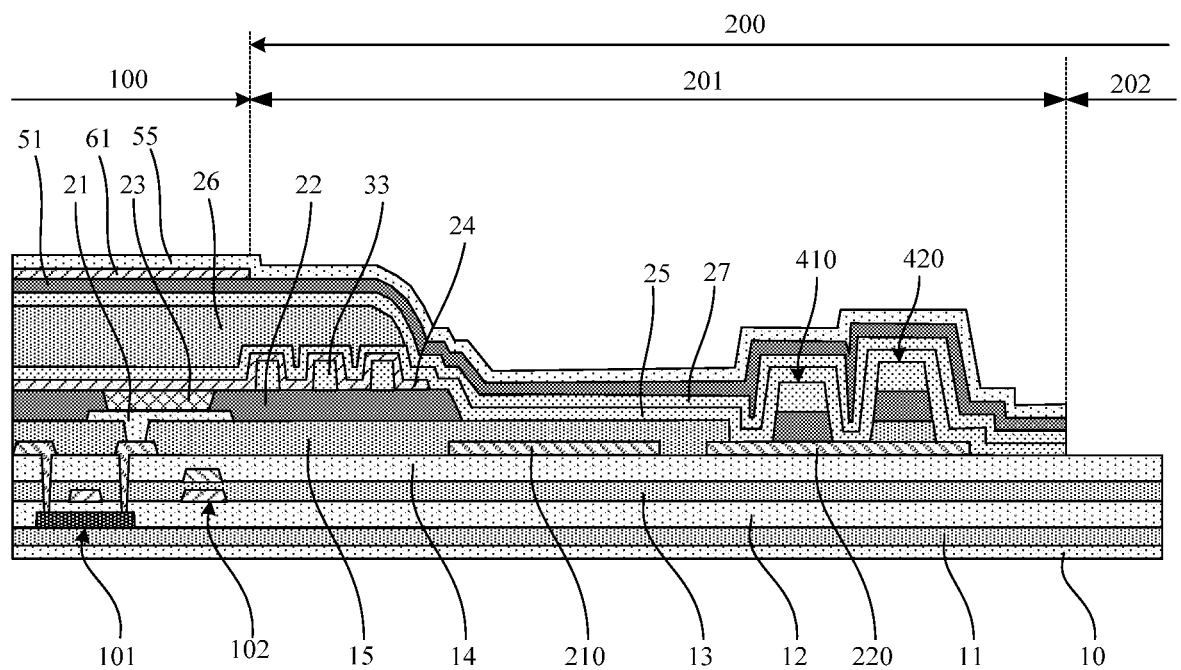
FIG. 18 is a schematic diagram of a display substrate subsequent to the formation of a capping layer in the process of manufacturing the display substrate in some exemplary embodiments.

Eventually, a capping thin film is coated on the substrate 10 on which the above patterns have been formed. A capping layer 55 is formed in the display area 100 and in the bonding area 200 by masking, exposure and development processes, covering the touch metal layer 61 and exposing the bonding pads of the bonding pad area 202, as shown in FIG. 18. The material of the capping layer 55 may be an organic material, and may be an inorganic material in other embodiments.

Figure 19:
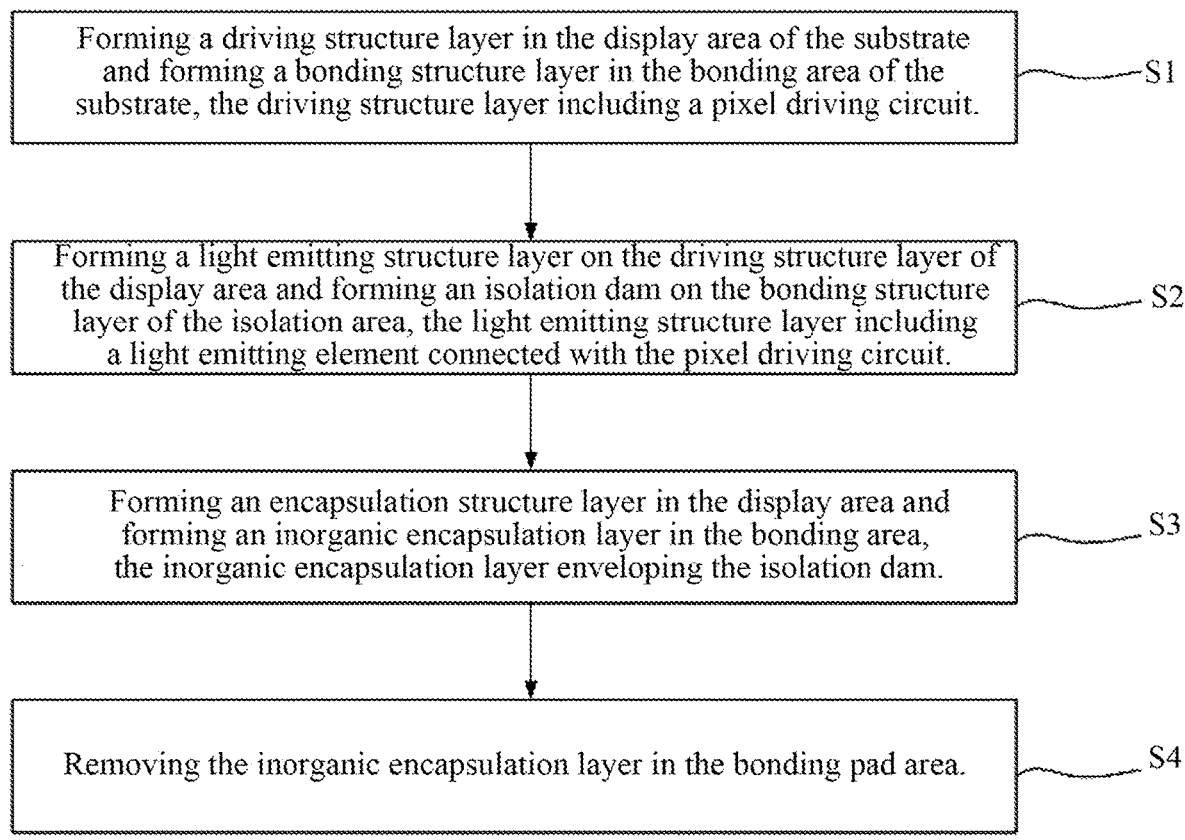
FIG. 19 is a flow chart of manufacturing a display substrate according to some exemplary embodiments.

Based on the above content, the embodiments of present disclosure provide a method for manufacturing a display substrate. The display substrate includes a display area and a bonding area located at one side of the display area. The bonding area includes an isolation area located close to the display area and a bonding pad area located at a side of the isolation area away from the display area. As shown in FIG. 19, the manufacturing method includes the following steps:

S1: A driving structure layer is formed in the display area of the substrate and a bonding structure layer is formed in the bonding area of the substrate, the driving structure layer including a pixel driving circuit.

S2: A light emitting structure layer is formed on the driving structure layer of the display area and an isolation dam is formed on the bonding structure layer of the isolation area, the light emitting structure layer including a light emitting element connected with the pixel driving circuit.

S3: An encapsulation structure layer is formed in the display area and an inorganic encapsulation layer is formed in the bonding area, the inorganic encapsulation layer enveloping the isolation dam.

S4: The inorganic encapsulation layer in the bonding pad area is removed.

In an exemplary embodiment, the formation of the encapsulation structure layer in the display area and the formation of the inorganic encapsulation layer in the bonding area include the following acts:

A first inorganic encapsulation layer is formed on the entire surface of the substrate on which the light emitting structure layer and the isolation dam have been formed.

An organic encapsulation layer is formed on the first inorganic encapsulation layer in the display area.

A second inorganic encapsulation layer is formed on the entire surface of the substrate on which the organic encapsulation layer has been formed.

In some exemplary embodiments, the manufacturing method further includes the following acts prior to the removal of the inorganic encapsulation layer:

A protection layer is formed on the entire surface of the substrate on which the second inorganic encapsulation layer is formed.

A first touch metal layer is formed on the protection layer, the first touch metal layer including connecting bridges disposed in the display area.

A touch insulation layer is formed on the entire surface of the substrate on which the first touch metal layer is formed.

The removal of the inorganic encapsulation layer in the bonding pad area includes the removal of the touch insulation layer, the protection layer, the second inorganic encapsulation layer and the first inorganic encapsulation layer in the bonding pad area.

The manufacturing method further includes the following act subsequent to the removal the inorganic encapsulation layer of the bonding pad area: A second touch metal layer is formed on the touch insulation layer. The second touch metal layer includes multiple first touch electrodes arranged along a first direction in the display area and multiple second touch electrodes arranged at intervals along a second direction in the display area. Adjacent two first touch electrodes are integrally connected, and adjacent two second touch electrodes are connected with the connecting bridges through via holes provided on the touch insulation layer.

In some exemplary embodiments, the manufacturing method further includes the following acts prior to the removal of the inorganic encapsulation layer of the bonding pad area:

A protection layer is formed on the entire surface of the substrate on which the second inorganic encapsulation layer has been formed.

A touch metal layer is formed on the protection layer, the touch metal layer including multiple touch electrodes disposed in the display area.

The removal of the inorganic encapsulation layer of the bonding pad area includes the removal of the protection layer, the second inorganic encapsulation layer and the first inorganic encapsulation layer in the bonding pad area.

In some exemplary embodiments, the manufacturing method further includes the act that a capping layer covering the touch metal layer is formed, subsequent to the removal of the protection layer, the second inorganic encapsulation layer and the first inorganic encapsulation layer in the bonding pad area.

In some exemplary embodiments, the manufacturing method further includes the following acts subsequent to the removal of the inorganic encapsulation layer of the bonding pad area:

A protection layer is formed on the entire surface of the substrate on which the encapsulation structure layer and the inorganic encapsulation layer have been formed.

A first touch metal layer is formed on the protection layer, the first touch metal layer including connecting bridges disposed in the display area.

A touch insulation layer is formed on the entire surface of the substrate on which the first touch metal layer has been formed.

The touch insulation layer and the protection layer of the bonding pad area are removed.

A second touch metal layer is formed on the touch insulation layer. The second touch metal layer includes multiple first touch electrodes arranged along a first direction in the display area and multiple second touch electrodes arranged at intervals along a second direction in the display area. Adjacent two first touch electrodes are integrally connected, and adjacent two second touch electrodes are connected with the connecting bridges through via holes provided on the touch insulation layer.

In some exemplary embodiments, the manufacturing method further includes the following acts subsequent to the removal of the inorganic encapsulation layer of the bonding pad area:

A protection layer is formed on the entire surface of the substrate on which the encapsulation structure layer and the inorganic encapsulation layer have been formed.

A touch metal layer is formed on the protection layer, the touch metal layer including multiple touch electrodes disposed in the display area.

The protection layer in the bonding pad area is removed.

A capping layer covering the touch metal layer is formed.

An embodiment of the present disclosure further provides a display device which includes the display substrate in any one of the aforementioned embodiments. The display device may be any product or component with a display function such as a mobile phone, a tablet computer, a television, a display, a laptop computer, a digital photo frame, a navigator, etc.

In the description of embodiments of the present disclosure, orientation or positional relationships indicated by terms including "on", "under", "left", "right", "upper", "inside", "outside", "axial direction", "four corners" and the like are based on the orientation or positional relationships shown in the drawings, and are for an easy and brief description of the present disclosure and are not intended to indicate or imply that the mentioned structures must have a specific orientation, or be constructed and operated in a particular orientation, and therefore these expressions should not be construed as limitation to the present disclosure.

In the description of embodiments of the present disclosure, unless explicitly specified and limited otherwise, the terms "connection", "fixed connection", "installation" and "assembly" are to be understood in their broadest sense. For example, "connection" may be fixed connection, or detachable connection, or integral connection. The terms "installation", "connection" and "fixed connection" may be direct connection, or may be indirect connection via an intermediate medium, or may be internal connection between two elements. Those of ordinary skills in the art can understand the specific meanings of the above mentioned terms in the present disclosure according to specific context.

What is claimed is:

1. A manufacturing method for a display substrate, wherein
    the display substrate comprises a display area and a bonding area disposed at one side of the display area, wherein the bonding area comprises an isolation area disposed close to the display area and a bonding pad area disposed at one side of the isolation area away from the display area, and
    the manufacturing method comprises:
    forming a driving structure layer in the display area of a substrate and forming a bonding structure layer in the bonding area of the substrate, wherein the driving structure layer comprises a pixel driving circuit,
    forming a light emitting structure layer on the driving structure layer in the display area and forming an isolation dam on the bonding structure layer in the isolation area, wherein the light emitting structure layer comprises a light emitting element which is connected with the pixel driving circuit,
    forming an encapsulation structure layer in the display area and forming an inorganic encapsulation layer in the bonding area, wherein the inorganic encapsulation layer envelops the isolation dam, and
    removing the inorganic encapsulation layer in the bonding pad area,
    wherein forming the encapsulation structure layer in the display area and forming the inorganic encapsulation layer in the bonding area comprises:
    forming a first inorganic encapsulation layer on an entire surface of the substrate on which the light emitting structure layer and the isolation dam have been formed,
    forming an organic encapsulation layer on the first inorganic encapsulation layer in the display area, and forming a second inorganic encapsulation layer on the entire surface of the substrate on which the organic encapsulation layer has been formed.

2. The manufacturing method for the display substrate according to claim 1, wherein
prior to removing the inorganic encapsulation layer in the bonding pad area, the manufacturing method further comprises:
forming a protection layer on the entire surface of the substrate on which the second inorganic encapsulation layer has been formed,
forming a first touch metal layer on the protection layer, wherein the first touch metal layer comprises connecting bridges provided in the display area,
forming a touch insulation layer on the entire surface of the substrate on which the first touch metal layer has been formed,
wherein removing the inorganic encapsulation layer in the bonding pad area comprises removing the touch insulation layer, the protection layer, the second inorganic encapsulation layer and the first inorganic encapsulation layer in the bonding pad area,
subsequent to removing the inorganic encapsulation layer in the bonding pad area, the manufacturing method further comprises: forming a second touch metal layer on the touch insulation layer, wherein the second touch metal layer comprises a plurality of first touch electrodes arranged along a first direction and a plurality of second touch electrodes arranged at intervals along a second direction, adjacent two first touch electrodes being integrally connected, and adjacent two second touch electrodes being connected with the connecting bridges through via holes provided on the touch insulation layer.

3. A display substrate, comprising:
a display area and a bonding area disposed at one side of the display area, wherein the bonding area comprises an isolation area disposed close to the display area and a bonding pad area disposed at one side of the isolation area away from the display area, and the display substrate is manufactured using a manufacturing method according to claim 2.

4. The manufacturing method for the display substrate according to claim 1, wherein prior to removing the inorganic encapsulation layer in the bonding pad area, the manufacturing method further comprises:
forming a protection layer on the entire surface of the substrate on which the second inorganic encapsulation layer has been formed, and
forming a touch metal layer on the protection layer, wherein the touch metal layer comprises multiple touch electrodes disposed in the display area,
wherein removing the inorganic encapsulation layer in the bonding pad area comprises: removing the protection layer, the second inorganic encapsulation layer and the first inorganic encapsulation layer in the bonding pad area.

5. The manufacturing method for the display substrate according to claim 4, wherein subsequent to removing the protection layer, the second inorganic encapsulation layer and the first inorganic encapsulation layer in the bonding pad area, the manufacturing method further comprises: forming a capping layer covering the touch metal layer.

6. A display substrate, comprising:
a display area and a bonding area disposed at one side of the display area, wherein the bonding area comprises an isolation area disposed close to the display area and a bonding pad area disposed at one side of the isolation area away from the display area, and the display substrate is manufactured using a manufacturing method according to claim 5.

7. A display substrate, comprising:
a display area and a bonding area disposed at one side of the display area, wherein the bonding area comprises an isolation area disposed close to the display area and a bonding pad area disposed at one side of the isolation area away from the display area, and the display substrate is manufactured using a manufacturing method according to claim 4.

8. The manufacturing method for the display substrate according to claim 1, wherein subsequent to removing the inorganic encapsulation layer in the bonding pad area, the manufacturing method further comprises:
forming a protection layer on the entire surface of the substrate on which the encapsulation structure layer and the inorganic encapsulation layer have been formed;
forming a first touch metal layer on the protection layer, wherein the first touch metal layer comprises connecting bridges provided in the display area,
forming a touch insulation layer on the entire surface of the substrate on which the first touch metal layer has been formed,
removing the touch insulation layer and the protection layer in the bonding pad area, and
forming a second touch metal layer on the touch insulation layer, wherein the second touch metal layer comprises a plurality of first touch electrodes arranged along a first direction in the display area and a plurality of second touch electrodes arranged at intervals along a second direction in the display area, adjacent two first touch electrodes being integrally connected, and adjacent two second touch electrodes being connected with the connecting bridges through the via holes provided on the touch insulation layer.

9. The manufacturing method for the display substrate according to claim 1, wherein subsequent to removing the inorganic encapsulation layer in the bonding pad area, the manufacturing method further comprises:
forming a protection layer on the entire surface of the substrate on which the encapsulation structure layer and the inorganic encapsulation layer have been formed;
forming a touch metal layer on the protection layer, wherein the touch metal layer comprises multiple touch electrodes disposed in the display area,
removing the protection layer in the bonding pad area, and
forming a capping layer covering the touch metal layer.

10. A display substrate, comprising:
a display area and a bonding area disposed at one side of the display area, wherein the bonding area comprises an isolation area disposed close to the display area and a bonding pad area disposed at one side of the isolation area away from the display area, and the display substrate is manufactured using a manufacturing method according to claim 1.

11. The display substrate according to claim 10, wherein the display area comprises a driving structure layer, a light emitting structure layer and a encapsulation structure layer which are stacked on the substrate, wherein the driving structure layer comprises a pixel driving circuit, the light emitting structure layer comprises a light emitting element connected with the pixel driving circuit, the bonding area comprises a bonding structure layer disposed on the substrate, wherein the bonding structure layer in the isolation area is provided with an isolation dam, the bonding area further comprises an inorganic encapsulation layer which covers the bonding structure layer in the isolation area, envelops the isolation dam and exposes the bonding structure layer in the bonding pad area.

12. The display substrate according to claim 11, wherein the bonding structure layer in the isolation area comprises a composite insulation layer disposed on the substrate, a first power line and a second power line which are disposed on the composite insulation layer, and a planarization layer disposed on the composite insulation layer, the first power line being disposed closer to the display area than the second power line, the isolation dam is disposed on the second power line, the planarization layer in the isolation area covers the first power line and exposes a surface of the second power line away from the substrate and a surface of the composite insulation layer being on a side of the isolation dam away from the display area, the inorganic encapsulation layer is disposed on the planarization layer and on the composite insulation layer being on a side of the isolation dam away from the display area.

13. The display substrate according to claim 11, further comprising: a protection layer, a first touch metal layer, a touch insulation layer and a second touch metal layer which are stacked on the encapsulation structure layer, wherein the first touch metal layer comprises connecting bridges provided in the display area, and the second touch metal layer comprises a plurality of first touch electrodes arranged in a first direction in the display area and a plurality of second touch electrodes arranged at intervals in a second direction in the display area, adjacent two first touch electrodes being integrally connected, and adjacent two second touch electrodes being connected with the connecting bridges through via holes provided on the touch insulation layer.

14. A display device, comprising the display substrate according to claim 10.

15. The display device according to claim 14, wherein
the display area comprises the driving structure layer, the light emitting structure layer and the encapsulation structure layer which are stacked on a substrate, wherein the driving structure layer comprises the pixel driving circuit, the light emitting structure layer comprises the light emitting element connected with the pixel driving circuit, the bonding area comprises the bonding structure layer disposed on the substrate, wherein the bonding structure layer in the isolation area is provided with the isolation dam, the bonding area further comprises the inorganic encapsulation layer which covers the bonding structure layer in the isolation area, envelops the isolation dam and exposes the bonding structure layer in the bonding pad area.

16. The display device according to claim 15, wherein
the bonding structure layer in the isolation area comprises a composite insulation layer disposed on the substrate, a first power line and a second power line which are disposed on the composite insulation layer, and a planarization layer disposed on the composite insulation layer, the first power line being disposed closer to the display area than the second power line on which the isolation dam is disposed, the planarization layer in the isolation area covers the first power line and exposes a surface of the second power line away from the substrate and a surface of the composite insulation layer being on a side of the isolation dam away from the display area, the inorganic encapsulation layer is disposed on the planarization layer and on the composite insulation layer being on a side of the isolation dam away from the display area.

17. The display device according to claim 15, wherein the display substrate further comprises a protection layer, a first touch metal layer, a touch insulation layer and a second touch metal layer which are stacked on the encapsulation structure layer, wherein the first touch metal layer comprises connecting bridges provided in the display area, and the second touch metal layer comprises a plurality of first touch electrodes arranged in a first direction in the display area and a plurality of second touch electrodes arranged at intervals in a second direction in the display area, adjacent two first touch electrodes being integrally connected, and adjacent two second touch electrodes being connected with the connecting bridges through via holes provided on the touch insulation layer.

* * * * *